United States Patent
Nakano et al.

(10) Patent No.: US 7,109,558 B2
(45) Date of Patent: Sep. 19, 2006

(54) POWER MOS TRANSISTOR HAVING CAPABILITY FOR SETTING SUBSTRATE POTENTIAL INDEPENDENTLY OF SOURCE POTENTIAL

(75) Inventors: Takashi Nakano, Aichi-ken (JP); Satoshi Shiraki, Toyohashi (JP); Yutaka Fukuda, Kariya (JP); Nobumasa Ueda, Nagoya (JP); Shoji Miura, Aichi-ken (JP)

(73) Assignee: Denso Corporation, Kariya (JP)

( * ) Notice: Subject to any disclaimer, the term of this patent is extended or adjusted under 35 U.S.C. 154(b) by 98 days.

(21) Appl. No.: 10/160,098

(22) Filed: Jun. 4, 2002

(65) Prior Publication Data

US 2002/0185681 A1 Dec. 12, 2002

(30) Foreign Application Priority Data

Jun. 6, 2001 (JP) .................................... 2001-170861
Dec. 21, 2001 (JP) .................................... 2001-390431

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. ....................................... 257/401; 257/901
(58) Field of Classification Search ................. 257/401, 257/901

See application file for complete search history.

(56) References Cited

U.S. PATENT DOCUMENTS

| 4,553,084 A | 11/1985 | Wrathall |
| 5,355,008 A * | 10/1994 | Moyer et al. ............... 257/341 |
| 5,412,239 A | 5/1995 | Williams |
| 5,517,046 A | 5/1996 | Hsing et al. |
| 5,672,894 A | 9/1997 | Maeda et al. |
| 5,834,814 A * | 11/1998 | Ito ................................ 257/378 |
| 5,999,041 A | 12/1999 | Nagata et al. |
| 6,140,678 A | 10/2000 | Grabowski et al. |
| 6,160,289 A * | 12/2000 | Kwon et al. ................ 257/335 |
| 6,242,787 B1 | 6/2001 | Nakayama et al. |
| 6,396,249 B1 | 5/2002 | Itakura et al. |

FOREIGN PATENT DOCUMENTS

| JP | A-H01-227520 | 9/1989 |
| JP | A-H02-309714 | 12/1990 |
| JP | A-H03-82151 | 4/1991 |

(Continued)

OTHER PUBLICATIONS

US 2002/0017697 A1 (corres. to JP 10-4180).
U.S.S.N. 09/391,236 (corres. to JP 2000-101073).

*Primary Examiner*—Howard Weiss
(74) *Attorney, Agent, or Firm*—Posz Law Group, PLC

(57) ABSTRACT

A power MOS transistor formed of an array of source cells and drain cells on an IC chip substrate has a plurality of substrate contact cells, each formed external to the source cells, having respective substrate potential-setting electrodes to which an externally supplied substrate bias voltage can be applied, enabling the substrate potential to be set independently of the source potential of the transistor. It thereby becomes possible to modify the threshold voltage of the transistor or maintain a constant potential difference between the substrate potential and that of a gate input signal. Since the requirement for a substrate contact region within each source cell is eliminated, and the number of substrate contact cells can be fewer than that of the source cells, the chip area occupied by the transistor can be reduced by comparison with a prior art configuration providing such a substrate potential control capability.

19 Claims, 24 Drawing Sheets

FOREIGN PATENT DOCUMENTS

| JP | A-UM-H04-032543 | 3/1992 |
| JP | A-H04-167813 | 6/1992 |
| JP | A-H06-077796 | 3/1994 |
| JP | 7-263665 | 10/1995 |
| JP | 8-125176 | 5/1996 |
| JP | 9-64707 | 3/1997 |
| JP | 9-266310 | 10/1997 |
| JP | 10-4180 | 1/1998 |
| JP | A-H10-032475 | 2/1998 |
| JP | A-H11-330451 | 11/1999 |
| JP | 2000-101073 | 4/2000 |
| JP | 2001-148464 | 5/2001 |
| JP | A-2001-168697 | 6/2001 |

* cited by examiner

TABLE 1

| No. | SUBSTRATE BIAS TRANSISTOR | BIAS APPLICATION INTERVALS (FIG. 31B) | BIAS VOLTAGE POLARITY | CHANGE IN THRESHOLD VOLTAGE Vt |
|---|---|---|---|---|
| 1 | Qs | X | POSITIVE | INCREASE |
| 2 | Qs | Y | NEGATIVE | DECREASE |
| 3 | Qf | X | NEGATIVE | DECREASE |
| 4 | Qf | Y | POSITIVE | INCREASE |

POWER MOS TRANSISTOR HAVING CAPABILITY FOR SETTING SUBSTRATE POTENTIAL INDEPENDENTLY OF SOURCE POTENTIAL

BACKGROUND OF THE INVENTION

1. Field of the Invention

The present invention relates to a power MOS transistor capable of passing a high level of drain current, which is formed of an array of MOSFET (metal-oxide-semiconductor field effect transistor) cells.

2. Description of the Prior Art

Types of LDMOS FET (lateral diffusion MOSFET, referred to in the following as a LDMOS transistor), formed of an array of interconnected MOSFET cells to constitute a power MOS transistor, are known in the prior art. Such a transistor has a multi-layer configuration of connecting leads, to thereby enable the area occupied by the connecting leads to be reduced and to enable the wiring resistance within the transistor to be lowered. An example of such a prior art LDMOS transistor configuration is shown in FIGS. 20 and 21. As illustrated in the plan view of FIG. 20, this has a conventional stripe configuration of MOSFET cells (source cells and drain cells). The respective source electrodes of the source cells are connected in common to a single connecting lead, which extends to the exterior of the transistor, and the set of gate electrodes and the set of drain electrodes are similarly respectively connected to individual connecting leads, which extend to the exterior of the transistor.

FIG. 21 is a cross-sectional view in elevation of a portion of such a LDMOS transistor, showing the configuration of one of the source cells. As shown in FIG. 21, a contact through-hole (referred to in the following simply as a contact hole) 100 formed in each source cell is large in size, and the source electrode has an $N^+$ source region 101 and a $P^+$ body contact region 102, both of which are at the substrate potential.

With an alternative configuration for such a power MOS transistor, as shown in FIG. 22, the substrate potential and the source potential can be controlled respectively independently. However in that case, it is necessary for the substrate contact area within each source cell to be large in size, so that the area occupied by each source cell becomes large, and hence the overall chip area that is occupied by the LDMOS transistor becomes large.

In addition, although there have been circuits proposed in the prior art for limiting the level of load current which flows in such power MOS transistor, i.e., for overcurrent protection, these have various disadvantages. An example of such a prior art circuit is disclosed in U.S. Pat. No. 4,553,084, and is shown in FIG. 30. Here, a load 200 and a power MOS transistor 201 are connected in series across a power supply voltage, while a sensing transistor 202 and a sensing resistor 203 are connected in series between the drain and source electrodes of the power MOS transistor 201. A gate drive circuit 204 applies a gate drive signal to the gate electrodes of the transistors 201 and 202, so that a form of current mirror relationship exists between the drain currents of these transistors, in the sense that the ratio of the drain currents of transistors 201, 202 is (ideally) always constant, i.e., although that ratio is extremely large, the respective waveforms of these drain currents should be identical, and synchronized with one another.

A voltage whose level represents the level of current flow through the sensing transistor 202 is produced across the sensing resistor 203, and supplied to an amplifier 205. The output from the amplifier 205 can thereby be applied in some manner to prevent excessive current flow through the power MOS transistor 201, e.g., by being supplied to the gate drive circuit 204 such as to cause that circuit to modify the gate drive voltage in a direction which will reduce the level of current flow through the power MOS transistor 201, when the voltage across the sensing resistor 203 exceeds a certain value.

So long as both the power MOS transistor 201 and the sensing transistor 202 are operating with a relatively high value of drain-to-source voltage, with a relatively low level of current flow through the load 200 (i.e., with these transistors each operating in the saturation region of the Id/Vds characteristic, in which the drain current level is unaffected by changes in the drain-to-source voltage), the level of current flow through the sensing resistor 202 will be unaffected by the presence of the sensing resistor 203. In that region of operation, the aforementioned ratio of the drain current through the power MOS transistor 201 to the drain current through the sensing transistor 202 will be accurately maintained. However when the drain-to-source voltage of the sensing transistor 202 becomes low, i.e., when transistors 201, 202 each enter the ON (conducting) state, in which there is an approximately linear relation between the drain-to-source voltage of a FET and its drain current, the current flow through the sensing resistor 202 will be significantly reduced due to the voltage drop across the sensing resistor 203. That is to say, the ratio of the drain current level of transistor 201 to that of the sensing transistor 202 will be substantially increased.

For that reason, it is not possible for such a circuit to be used to perform accurate current limiting of the drain current through the power MOS transistor 201, since the relationship between the respective drain currents of the power MOS transistor and the sensing transistor 202 will vary in accordance with whether these transistors are currently operating in a transition condition between the fully ON and fully OFF states, or are operating in the ON state. Thus, the drain current of the sensing transistor 202 (and hence the voltage developed across the sensing resistor 203) cannot be used to accurately represent the level of load current being passed by the power MOS transistor 201, for the purpose of applying control to limit an excessive level of flow of that load current.

This is an especially serious problem when a power MOS transistor is to be utilized in a form of operation such as PWM (pulse width modulation), in which the transistor is repetitively switched between the ON and OFF states, and so repetitively changes between the transition condition and the fully ON condition, and such limiting to prevent excessive current flow through the power MOS transistor is to be applied, for example as described in Japanese patent No. HEI 9-64707.

SUMMARY OF THE INVENTION

It is an objective of the present invention to overcome the above problems of the prior art, by providing a power MOS transistor configured as an array of MOSFET cells, whereby the area occupied by each cell is small, and whereby the substrate potential can be set to a desired value, independently of the potential to which the source electrodes are set.

According to one aspect of the invention, it provides a power MOS transistor whereby it becomes unnecessary to provide a body contact region which is at the substrate potential, within a source contact hole or in a region immediately peripheral to such a contact hole, in the interior of each source cell of the power MOS transistor. Instead, body contact regions are formed external to the source cells. As a result, the surface area occupied by each source cell can be reduced, and in addition, the substrate potential can be set to a desired value, independently of the source potential. Furthermore since the overall number of body contact regions can be less than the number of source cells, the overall chip area occupied by such a power MOS transistor can be reduced by comparison with the prior art.

More specifically, the invention provides a power MOS transistor formed as an array of source cells having respective source electrodes thereof connected in common and drain cells having respective drain electrodes thereof connected in common, and an array of gate electrodes which are connected in common, within a transistor formation area on a substrate of an IC chip, with the power MOS transistor having a substrate region that is of a first conduction type and extends downwards from the upper face of the substrate, an electrically insulating layer formed on that upper face, and a plurality of contact holes respectively corresponding to the source cells formed in the electrically insulating layer. Each of the source cells occupies an area that is defined by the corresponding contact hole and a region around the periphery of that contact hole. The transistor further includes a channel region that is of a second conduction type, formed in the substrate region of the first conduction type, extending downward from the upper face of the substrate, a plurality of source regions which are of the first conduction type, and respectively correspond to the source cells, each formed in the channel region extending from the upper face, and an array of gate electrodes, each formed above the upper face of the substrate. Each gate electrode covers a part of the channel region, separated from that channel region by a gate insulation film. The source electrodes are each formed over the upper face of the substrate, in contact with the source regions through respective ones of the contact holes. Such a transistor is characterized in having a plurality of body contact regions extending from the substrate upper face, each having a corresponding substrate potential-setting electrode, to constitute a substrate contact cell, with each of these body contact region being located outside the areas occupied by the source cells. The potential of the substrate region that is of the first conduction type can thereby be set as required, i.e., as the potential of the substrate potential-setting electrodes.

In that way, since the substrate contact cells are disposed outside the source cells, the substrate potential of the power MOS transistor can be set independently of the substrate potential, without requiring that the area of each of the source cells be increased in order to provide that capability.

In addition, that aspect of the invention could also be applied to an IGBT (insulated gate bipolar transistor) type of power transistor which is formed with a plurality of emitter cells, with similar advantages being obtainable.

Due to the large number of drain electrodes and source electrodes which constitute a power MOS transistor, the total area of the gate electrodes is large, so that there is a significant amount of stray capacitance between the gate electrodes and the substrate. As another aspect, the invention provides a substrate potential control circuit which operates in synchronism with a gate input signal that is applied to the gate electrodes of a power MOS transistor configured as described above, for driving the transistor to the ON and OFF states. The substrate potential control circuit applies to the substrate of the power MOS transistor a drive signal voltage which varies, in relation to the gate input signal, such as to maintain the potential difference between the gate electrodes of the power MOS transistor and the substrate of that transistor at a substantially constant level. In that way, the amount of charging current which flows into the gate-to-substrate capacitance of the transistor can be substantially reduced, thereby enabling the performance of the transistor with respect to high-frequency switching to be improved.

Alternatively, the invention provides a substrate potential control circuit that operates in synchronism with a gate input signal of a power MOS transistor configured as described above, whereby a reverse bias potential is applied to the substrate potential-setting electrodes of the transistor during each interval in which the transistor is set in the OFF state by the gate input signal, and whereby the substrate potential is reduced to zero during each interval in which the transistor is in the ON state. In that way, the threshold voltage of the power MOS transistor can be held at an optimum level at all times.

Moreover, a power MOS transistor configured as described above can further be configured such that a plurality of sets of the substrate potential-setting electrodes, located in respectively different regions of the transistor formation area, can be supplied with respectively different drive signals. In that way, by applying a reverse substrate bias voltage of appropriate level to one or more of these sets of substrate potential-setting electrodes, the transistor elements formed of sets of source cells, drain cells and gate electrodes within each of these regions in which the reverse substrate bias is applied can be unconditionally fixed in the OFF state. The transistor elements in a region where the reverse substrate bias is not applied, on the other hand, can be controlled by the gate input signal. In that way, the power MOS transistor can be controlled as if it were a plurality of power MOS transistors connected in parallel, which can be selectively deactivated.

As another aspect, the invention provides a combination of a power MOS transistor which is configured as described above, which is coupled to drive a load, and an overcurrent limiting circuit including a sensing transistor, whereby the ratio of the drain current of the power MOS transistor to the drain current through the sensing transistor is held constant, during both a transition state of these transistors between a fully OFF (non-conducting) and fully ON (conducting) condition and also during the fully ON condition. In that way, the level of drain current of the sensing transistor can be used to accurately control a current limiting function that is applied to the power MOS transistor.

More specifically, the sensing transistor of the overcurrent limiting circuit is preferably formed on the substrate of the power MOS transistor, of a small number of cells, e.g., one source cell with its source electrode, one drain cell with its drain electrode, a gate electrode, and a substrate contact cell with its substrate potential-setting electrode. The source electrode is connected to the source electrodes of the power MOS transistor, the gate electrode is connected to the gate electrodes of the power MOS transistor, and the source electrode and substrate potential-setting electrode are respectively separate from the source electrodes and substrate potential-setting electrodes of the power MOS transistor. The sensing resistor is connected to the drain electrode of the sensing transistor, with the sensing transistor and sensing resistor connected in series between the source and drain electrodes of the power MOS transistor.

With a preferred embodiment, a substrate potential control circuit applies a reverse bias voltage to the substrate of the sensing transistor during each interval in which that transistor is being switched between the ON and OFF states by a gate input signal (i.e., intervals in which the drain current of that transistor is independent of its drain-to-source voltage) to thereby increase the threshold voltage of that transistor by a specific amount during these intervals. The amount of increase in threshold voltage is determined such as to cause a lowering of drain current of the sensing transistor by an amount that is identical to a lowering of drain current which occurs when that transistor enters the ON state (i.e., in which the drain current varies approximately linearly with respect to the drain-to-source voltage) due to the voltage drop across the sensing resistor. In that way, compensation is applied for the effects of the sensing resistor, so that there is an accurate current mirror relationship maintained between the respective drain currents of the sensing transistor and power MOS transistor, both during the ON state and in the switching transition intervals.

The voltage drop across the sensing resistor can thereby be used to accurately monitor the drain current of the power MOS transistor, for the purpose of applying overcurrent limiting.

DESCRIPTION OF PREFERRED EMBODIMENTS

Figure 1:
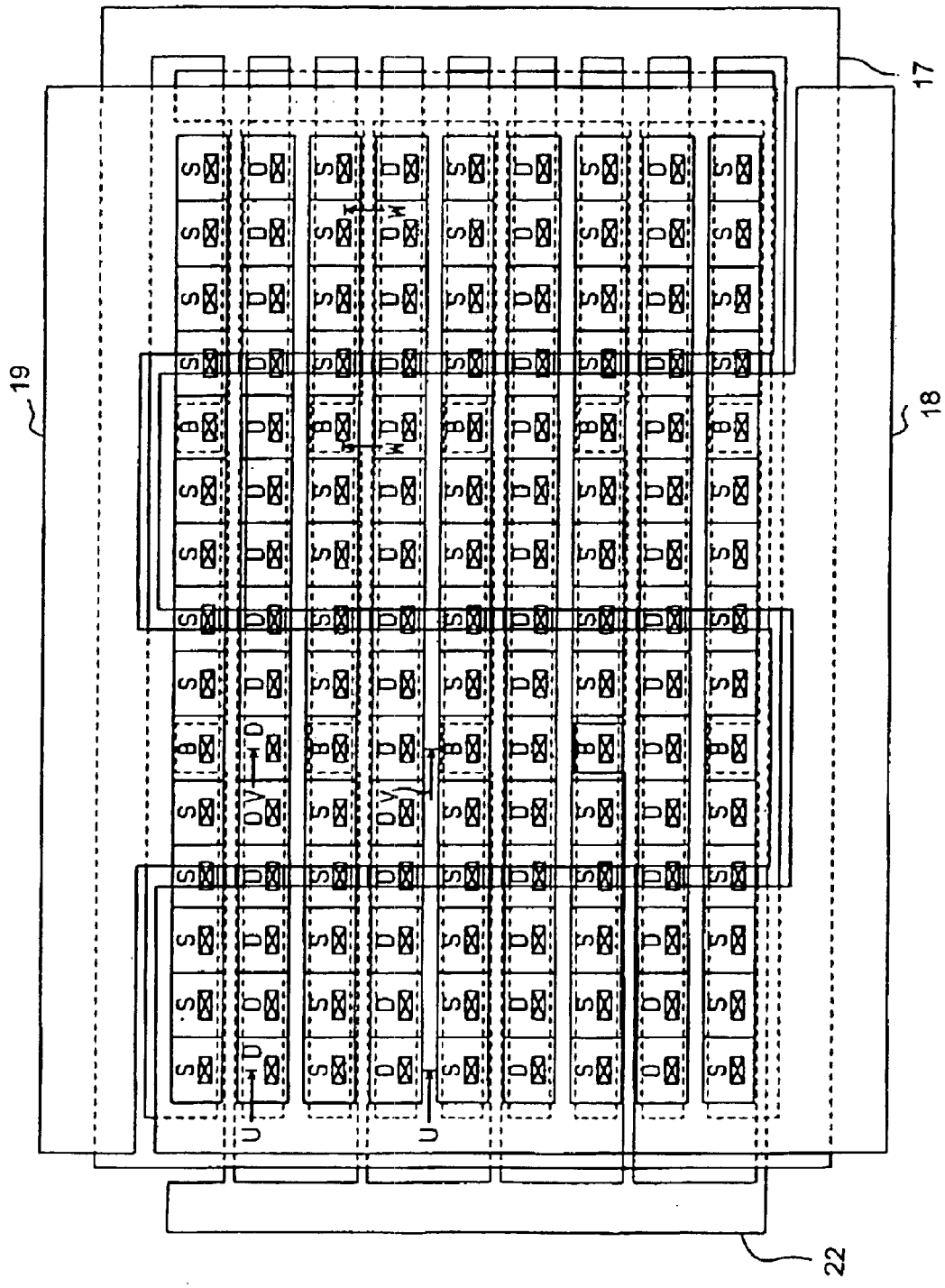
FIG. 1 is a plan view of an embodiment of a power MOS transistor.
Figure 6:
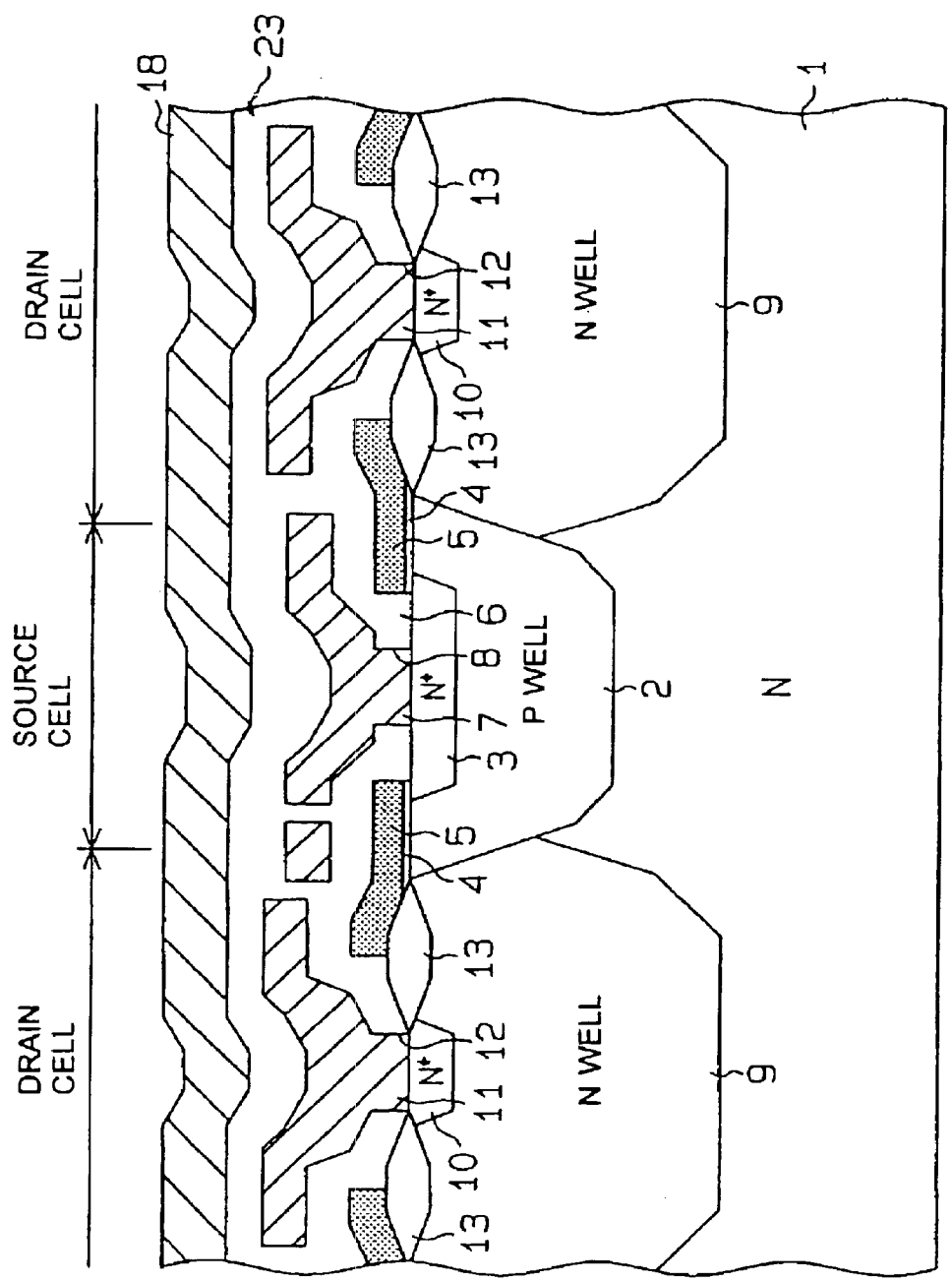
FIG. 6 is a cross-sectional view in elevation, taken through the line U—U in FIG. 1.
Figure 7:
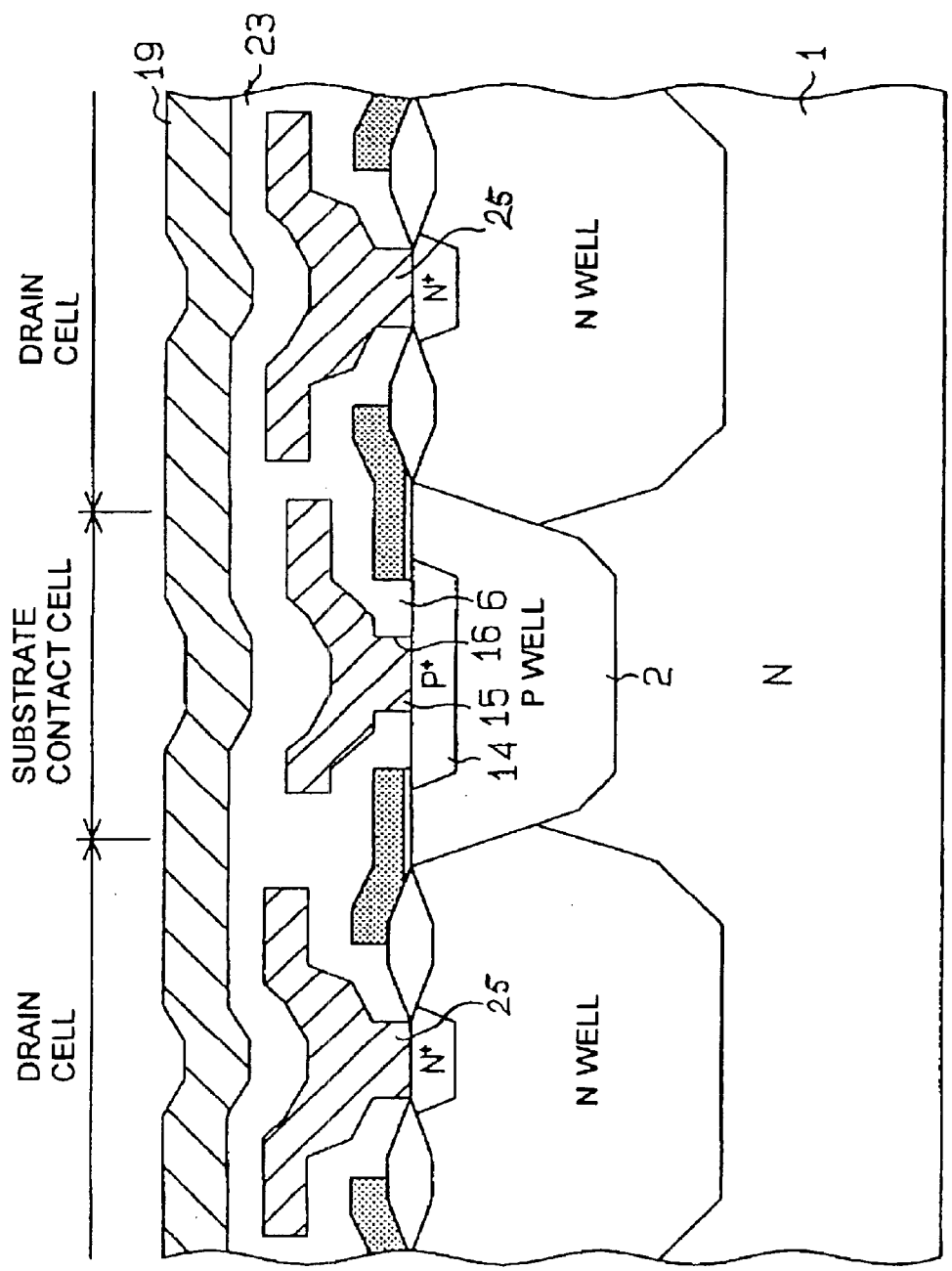
FIG. 7 is a cross-sectional view in elevation, taken through the line V—V in FIG. 1.
Figure 8:
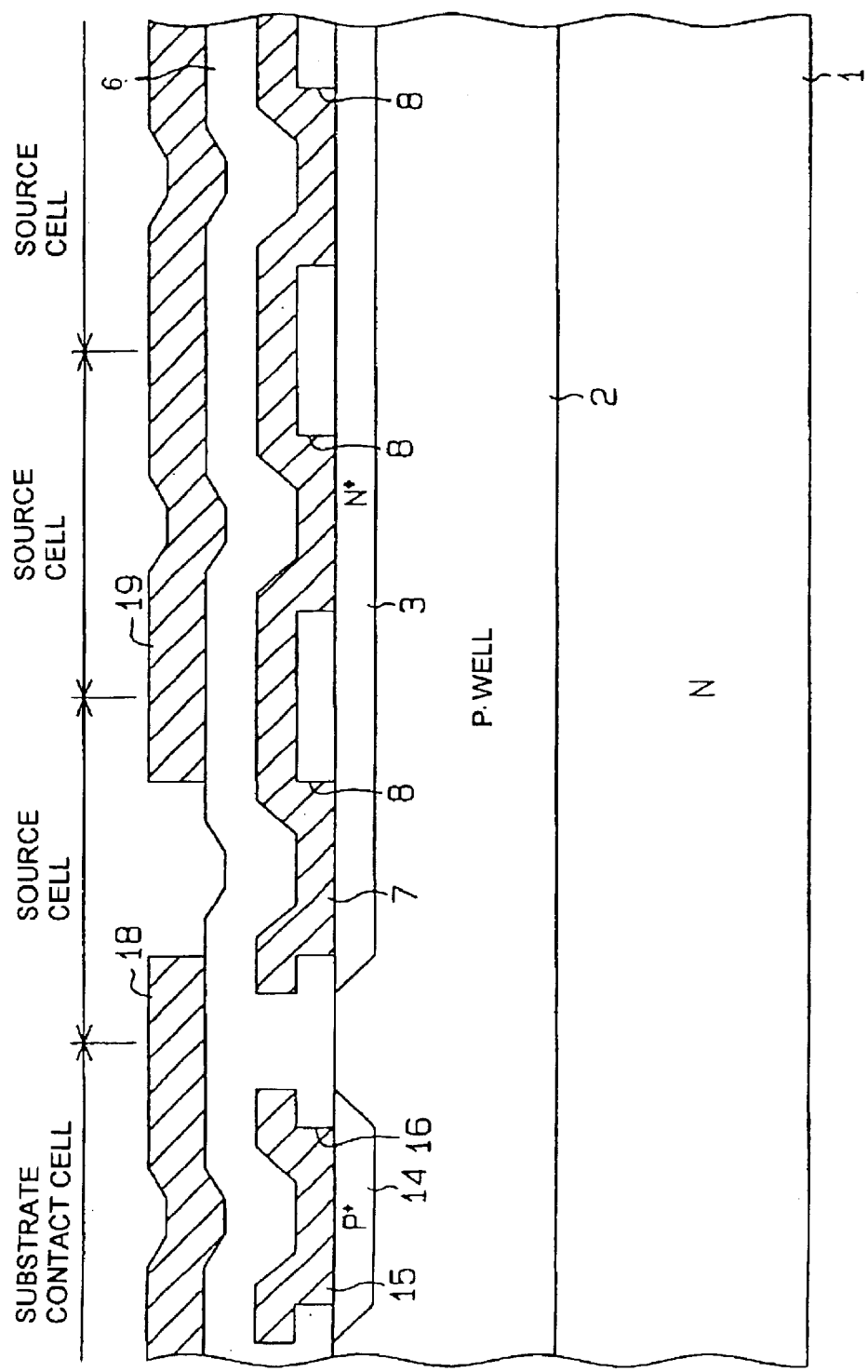
FIG. 8 is a cross-sectional view in elevation, taken through the line W—W in FIG. 1.

Embodiments of the invention will be described in the following, referring to the drawings. FIG. 1 is a plan view of an embodiment of a power MOS transistor, which is of N-channel LDMOS configuration, having a conventional stripe configuration of the source and drain cells. FIG. 6 is a partial cross-sectional view in elevation of this transistor, taken along the line U—U indicated in FIG. 1, showing the multi-layer connecting lead configuration. FIG. 7 is a further partial cross-sectional view in elevation, taken along the line V—V indicated in FIG. 1, while FIG. 8 is a further partial cross-sectional view in elevation, taken along the line W—W indicated in FIG. 1. FIG. 6 shows a single source cell and the two immediately adjacent drain cells, while FIG. 7 shows a single substrate contact cell and the two immediately adjacent drain cells, and FIG. 8 shows a single substrate contact cell and three successively adjacent source cells.

Figure 2:
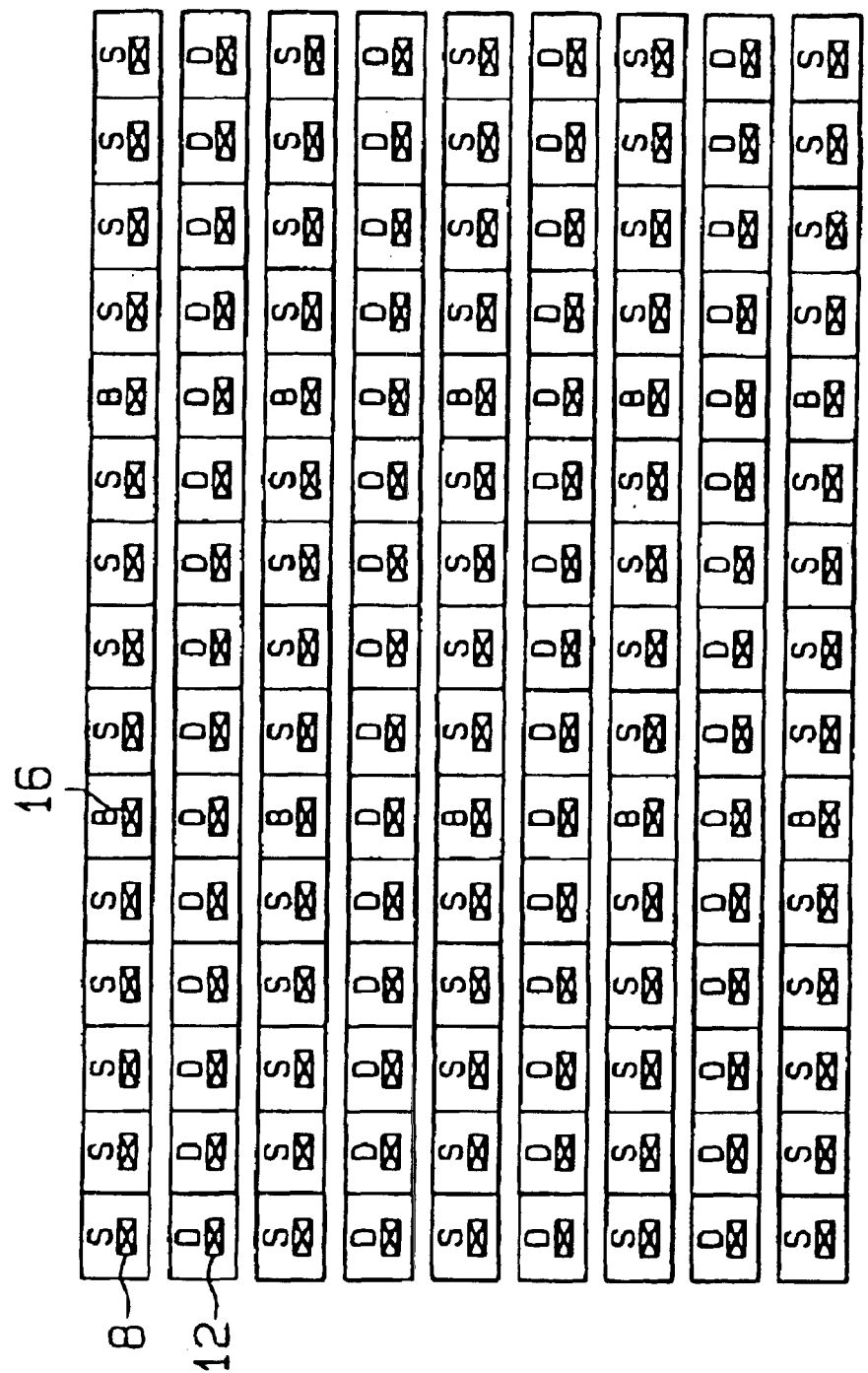
FIG. 2 is a plan view of the top surface of the semiconductor substrate of the embodiment of FIG. 1.
Figure 3:
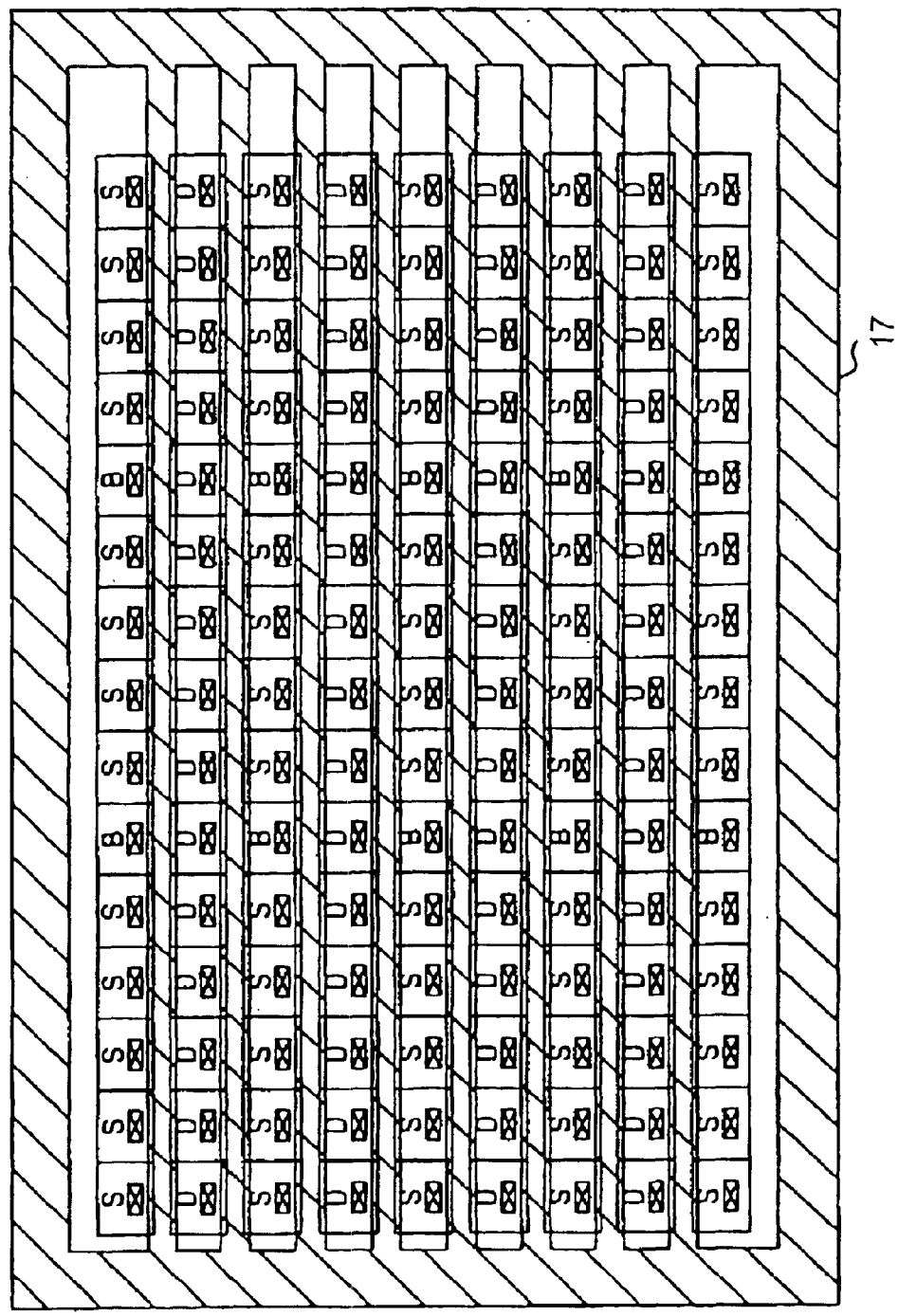
FIG. 3 is a plan view showing the arrangement of gate electrodes in relation to source and drain cells, in the embodiment of FIG. 1.
Figure 4:
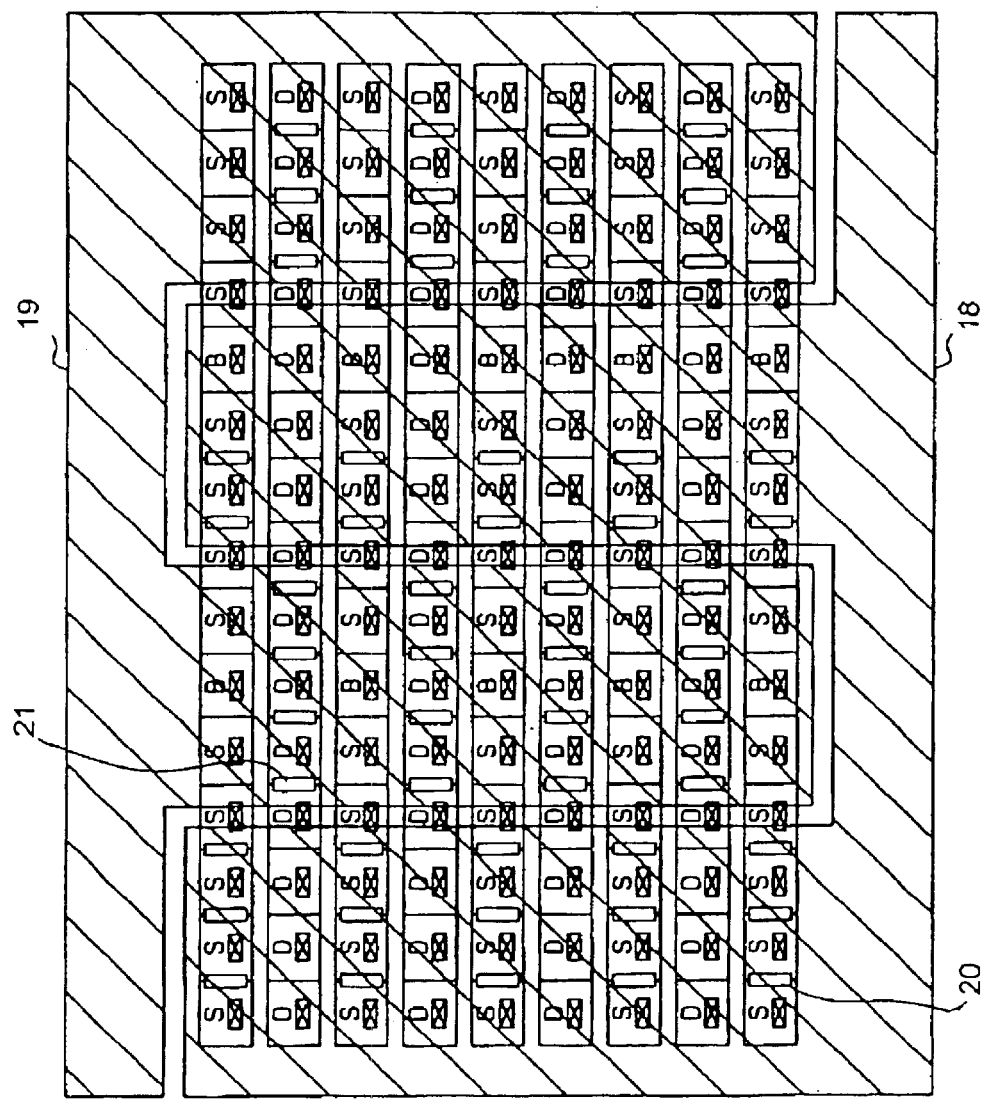
FIG. 4 is a plan view showing the arrangement of second-layer drain and source connecting leads, of the embodiment of FIG. 1.
Figure 5:
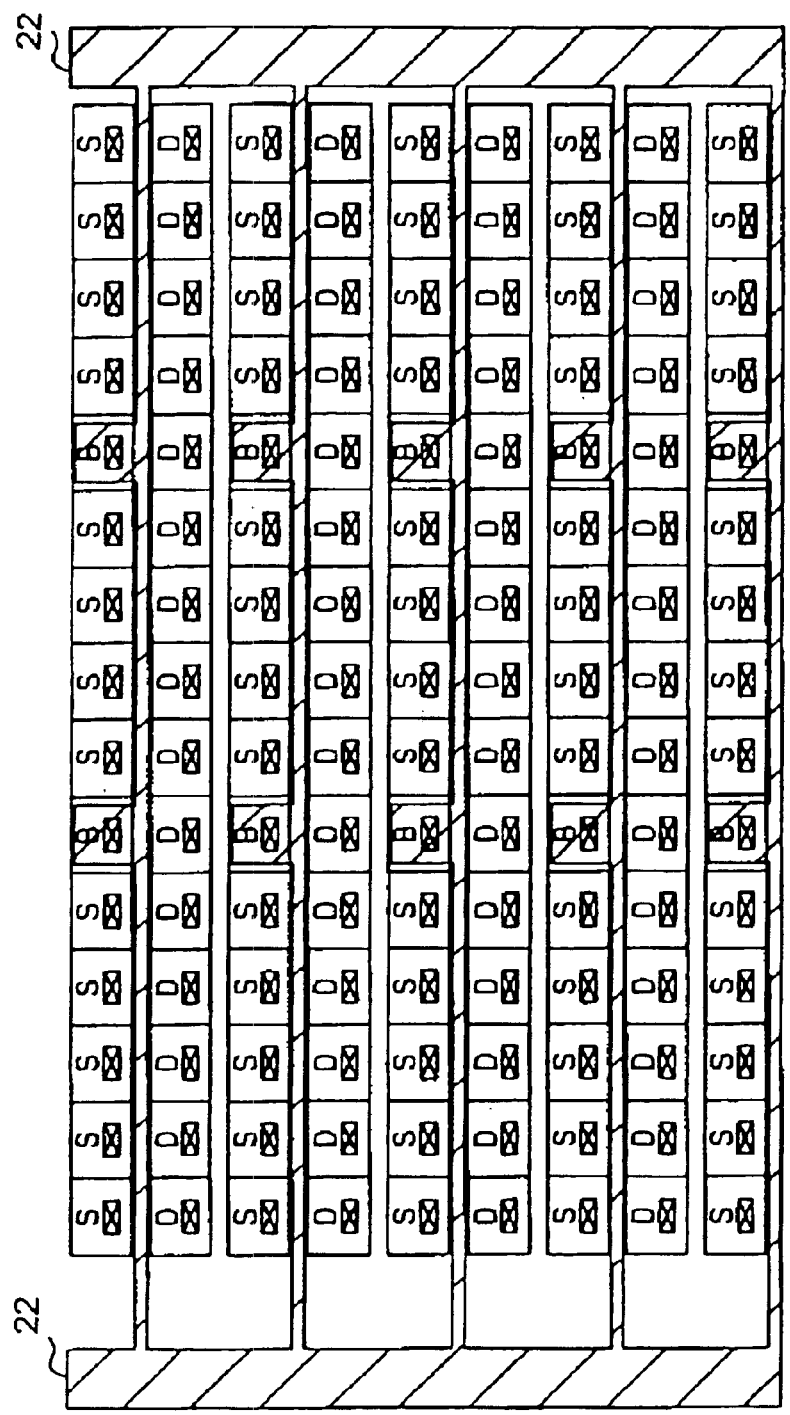
FIG. 5 is a plan view showing the relation of a substrate potential-setting connecting lead, in relation to substrate contact cells in the embodiment of FIG. 1.

FIG. 2 is a plan view of the substrate layer of the power MOS transistor of FIG. 1, showing the layout of source cells (each designated as S), drain cells (each designated as D) and substrate contact cells (each designated as B). FIG. 3 is a plan view showing the second-layer gate connecting lead 17, and FIG. 4 shows the second-layer source connecting lead 18 and the second-layer drain connecting lead 19. FIG. 5 shows the substrate potential-setting connecting lead 22.

In the source cell shown in FIG. 6, the substrate 1 (i.e., a semiconductor region of a first conduction type) has formed in a surface layer portion thereof a channel P well 2, while a N.sup.+ source region 3 is formed in a surface layer portion of the channel P well 2. A gate oxide film 4 is formed over part of the upper face of the substrate 1, at least within a portion of the channel P well 2, and a polysilicon gate electrode 5 is formed upon the gate oxide film 4. The polysilicon gate electrode 5 is covered by a silicon oxide film 6. A source electrode 7 is formed, of aluminum, on the silicon oxide film 6. The source electrode 7 is connected through a contact hole 8 to the N.sup.+ source region 3. The interior of a contact hole 8 and a peripheral portion thereof define a source cell, with a plurality of such source cells being formed. The source cells are preferably arrayed as a plurality of parallel rows of cells, as shown in FIG. 2.

With the source cell configuration shown in FIG. 6, N wells 9 are formed in regions of the upper surface of the substrate 1, with a N+ region 10 being formed in a surface layer portion of each N well 9. A drain electrode 11 formed of aluminum is disposed above the upper face of the substrate 1, and is configured such as to contact each N well 9 through a contact hole 12. The interior of a contact hole 12 and a peripheral portion thereof define a drain cell, with a plurality of such drain cells being formed. The drain cells are arrayed as a plurality of parallel rows of cells, with rows of drain cells and rows of source cells arranged in parallel in successive alternation, as shown in FIG. 2.

Furthermore, as shown in FIG. 6, a LOCOS (local oxide silicon) film 13 is formed between adjacent cells, e.g., between adjacent source and drain cells.

Within each row of source cells (i.e., at respective positions where a source cell would otherwise be located, as illustrated in FIGS. 1 to 3)) are formed one or more substrate contact cells B, each having the configuration shown in FIG. 7. Here, a channel P well 2 is formed in a surface layer portion of the substrate 1, and a P+ body contact region 14 is formed in a surface layer portion of the channel P well 2. A substrate potential-setting electrode 15, made of a metal such as aluminum, is formed on the silicon oxide film 6, and contacts the P+ body contact region 14 through the contact hole 16. The interior of a substrate potential-setting electrode 15 and a peripheral portion thereof define a substrate contact cell, with a plurality of such substrate contact cells being formed. The substrate contact cells are preferably arrayed within the rows of source cells as shown in FIG. 2, i.e., with a plurality of the substrate contact cells B being disposed within each row of source cells, and with these substrate contact cells being separated (within each row of source cells) by a plurality of source cells.

Each of the drain cells has a drain electrode 25 as shown in FIG. 7, with the drain electrodes 25 being connected to the second-layer drain connecting lead 19, shown in FIG. 1.

Thus with such a stripe-configuration LDMOS use is made of the fact that each of the rows of source cells occupies a common portion of the substrate, with at least one part of that common portion, i.e., within a row of source cells, being configured to function as a substrate contact region. In that way, the substrate potential can be controlled independently of the source potential of the LDMOS transistor by applying a bias voltage to the substrate potential-setting electrodes (connected in common to the substrate potential-setting connecting lead 22), without requiring an increase in the amount of area occupied by the elements of that transistor.

Within the multi-layer connecting lead configuration, the second-layer gate connecting lead 17 is laid out as shown in FIG. 3, with each polysilicon gate electrode 5 being connected through the second-layer gate connecting lead 17 to the exterior of the LDMOS transistor. In addition, the second-layer source connecting lead 18 and second-layer drain connecting lead 19 are respectively configured as illustrated in FIG. 4, with each source electrode 7 being connected through a via 20 to the second-layer source connecting lead 18, and with the second-layer drain connecting lead 19 being connected through respective via holes 21 to each of the drain electrode 11. Furthermore, as shown in FIG. 5, the substrate potential-setting connecting lead 22 is configured such as to be connected to the substrate potential-setting electrode 15 of the respective substrate contact cells B. In that way, the substrate potential at the locations of the various substrate contact cells B can be set by means of the common connecting lead 22.

In the manufacturing process for the multi-layer connecting lead configuration shown in FIGS. 6, 7 and 8, a silicon oxide film 23 is formed over the drain electrode 11 and the source electrode 7, and the second-layer source connecting lead 18 and the second-layer drain connecting lead 19 are then formed over that silicon oxide film 23.

With such a LDMOS transistor, as can be understood from the cross-sectional view of FIG. 6, when a voltage is applied to the polysilicon gate electrode 5, current flows from the drain electrode 11 through the N+ region 10, the N well 9, and a surface layer portion of the channel P well 2, into the source electrode 7.

Figure 9:
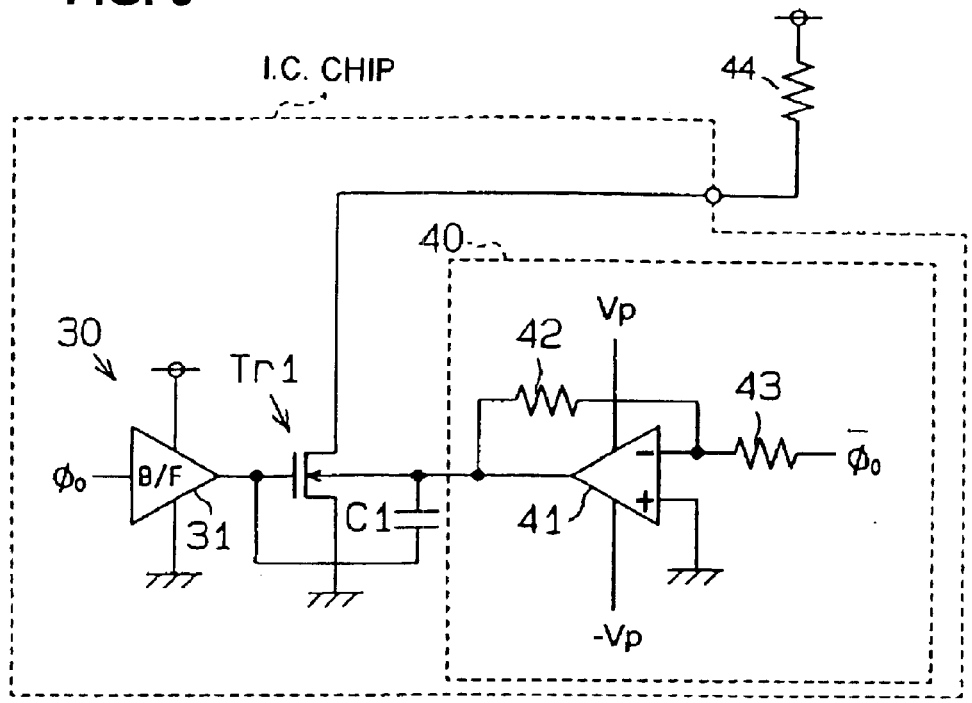
FIG. 9 is a circuit diagram showing an embodiment of a substrate potential control circuit for controlling the substrate potential of a power MOS transistor.

FIG. 9 shows an embodiment which constitutes an IC chip 45 on which a power MOS (LDMOS) transistor having the configuration of the first embodiment described above, designated as Tr1, is formed in conjunction with a gate drive circuit 30 and a substrate bias circuit 40. The drain side (specifically, the second-layer drain connecting lead 19 of the power MOS transistor Tr1 is connected to a load 44 which is external to the chip 45, while the source side of the power MOS transistor Tr1 (i.e., the second-layer source connecting lead 18) is connected to ground potential. That is to say, the load 44 is connected through the power MOS transistor Tr1 between the high potential of a power source and ground potential of that power source. The gate drive circuit 30 includes a buffer amplifier 31 and a transistor drive command signal (i.e., transistor ON/OFF switching signal) $\phi_0$ inputted to the gate electrode of the power MOS transistor Tr1 through the buffer amplifier 31. The substrate potential control circuit 40 includes an operational amplifier 41 and resistors 42, 43. The inverse of the aforementioned drive command signal $\phi_0$ is applied through the resistor 43 to the inverting input terminal of the operational amplifier 41, and the operational amplifier 41 is connected between positive and negative power supply voltages Vp and −Vp (e.g., +12V, −12V). The output terminal of the operational amplifier 41 is connected through the substrate potential-setting connecting lead 22 (shown in FIG. 1) to the substrate potential-setting electrode 15 (shown in FIG. 7) of each substrate contact cell B.

With such a power MOS transistor Tr1, there will exist a certain amount of stray gate-substrate capacitance, which is indicated as C1 in FIG. 9. When a drive signal is applied to the base electrode of the power MOS transistor to switch the transistor between the ON (i.e., conducting) and OFF (i.e., non-conducting) states, charging of this stray capacitance results in deterioration of the switching performance. However with the embodiment of FIG. 9, when the power MOS transistor Tr1 is set in the OFF state (i.e., the gate voltage of Tr1 is set to 0 V), a voltage −Vg (for example, −5 V) is applied as a substrate reverse bias voltage. Conversely when the transistor Tr1 is set in the ON state (e.g., the gate voltage is set to 5 V), the substrate potential is set to 0 V. In that way, the difference between the gate potential and the substrate potential is held fixed, and hence, the level of charging current which flows in the stray capacity C1 is made extremely small, and greater stability of control by the 31 is achieved. The switching performance is thereby improved substantially.

As can be understood from the above description, with the power MOS transistor configuration shown in FIG. 1, formed of source cells S, drain cells D and substrate contact cells B, rows of source cells S and drain cells D are arranged in successive alternation, with a plurality of substrate contact cells being provided within each row of source cells, and with each adjacent pair of the substrate contact cells within a row of source cells being separated from one another by a plurality of source cells. By thus providing substrate connection portions which are separate from source connection portions in that way, the substrate potential of the power MOS transistor can easily be controlled to a desired value (for example by the substrate potential control circuit 40 shown in FIG. 9) independently of the source potential, without increasing the surface area occupied by each element.

Figure 22:
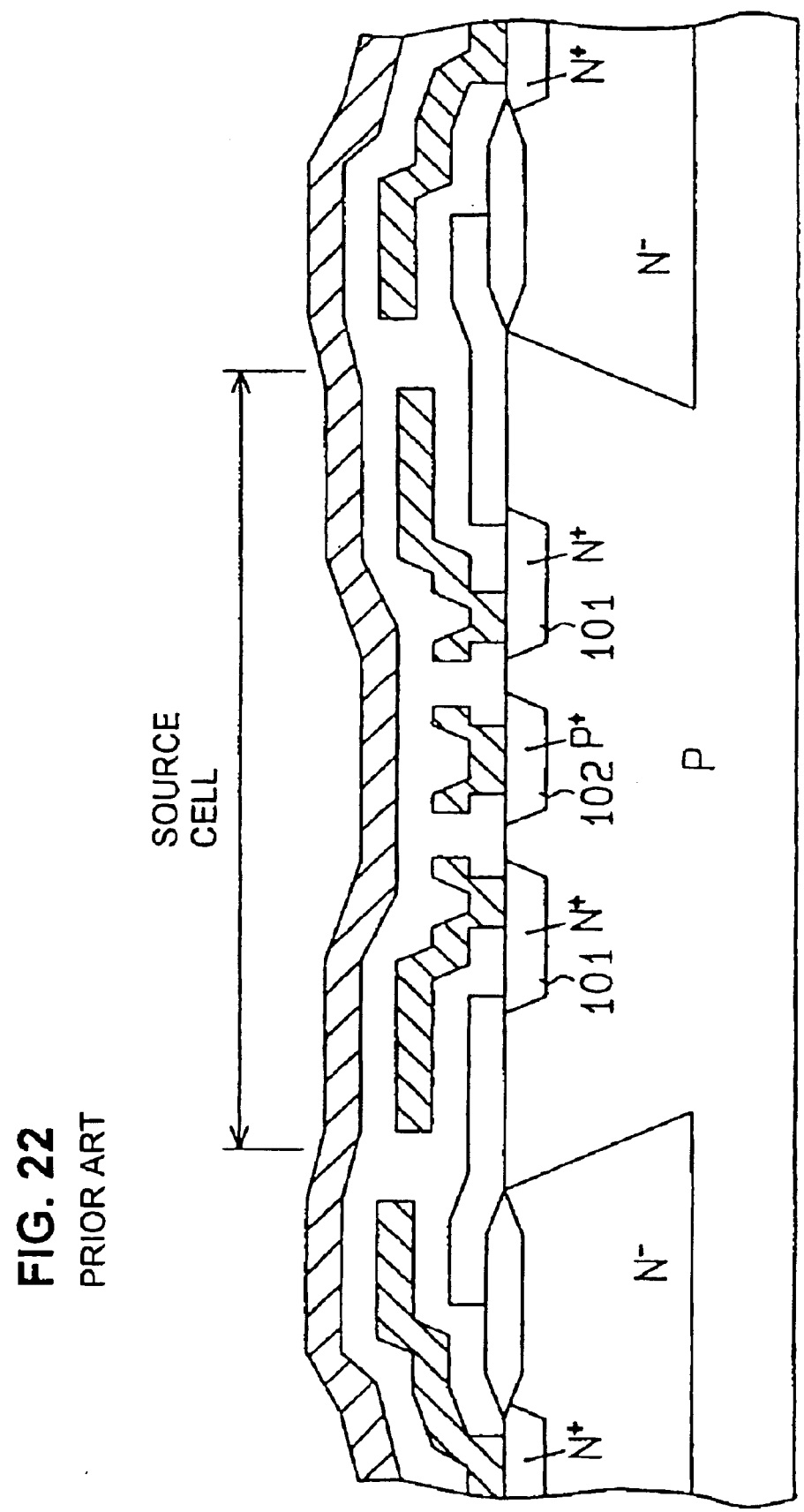
FIG. 22 is a cross-sectional view in elevation of a second example of a prior art type of power MOS transistor.

Furthermore as can be understood by comparing FIG. 6 with the prior art example of FIG. 22, the P$^+$ region 102 is disposed within the area of each source cell in that prior art example, whereas with the present invention, in effect, that P$^+$ region has been moved to a separate location. Hence the size of the area occupied by each source cell can be substantially reduced, with the configuration of the present invention for a power MOS transistor.

With a prior art configuration of a LDMOS power MOS transistor, each substrate contact is in general combined with a source contact. However by utilizing substrate contact cells as with the embodiment described above, it becomes possible to set the substrate potential independently of the source cells, i.e., the substrate potential can be separated from the source potential of the power MOS transistor. This is due to the fact that with the present invention it is not necessary to provide a body contact region in each source cell, within the contact hole 8 shown in FIG. 6 or a region at the periphery of that contact hole. Instead, a P$^+$ body contact region 14 (shown in FIG. 7) is formed outside the source cells. In that way, the overall area occupied by the power MOS transistor can be reduced (since the size of the source cells can be reduced by comparison with the prior art, while only a small number of substrate contact cells need be added), while providing the advantage of enabling the substrate potential to be set independently of the source potential.

For that purpose, the substrate contact cells 14 are each connected to an electrode 15, which is separate from the source electrode 7, and hence the substrate contact cells 14 can be coupled through the substrate potential-setting connecting lead 22 to a substrate bias circuit such as the circuit 40 of FIG. 9 described above, for thereby controlling the substrate potential. The range of applications of such a power MOS transistor can thereby be substantially extended.

Figure 10:
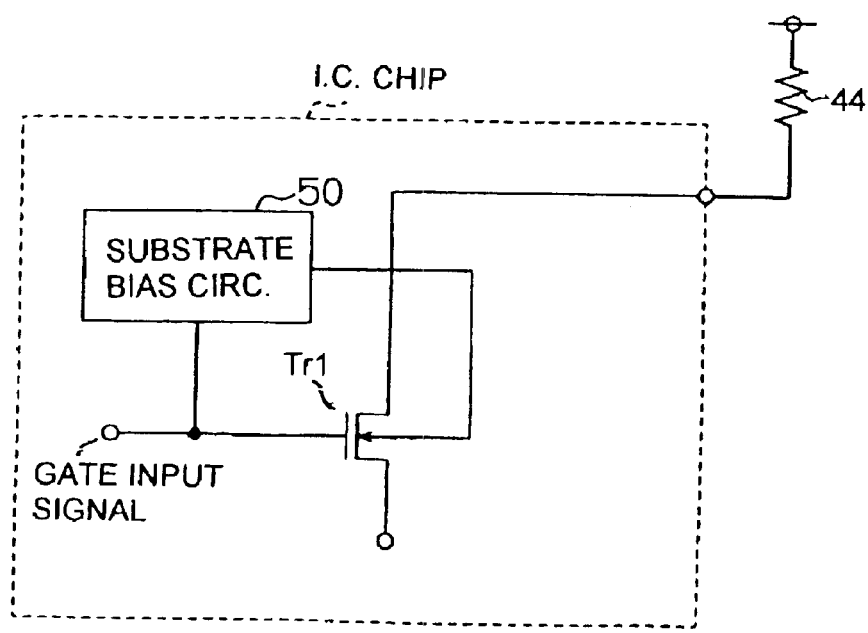
FIG. 10 is a circuit diagram showing an alternative embodiment of a substrate potential control circuit for controlling the substrate potential of a power MOS transistor.

A third embodiment is illustrated in the circuit diagram of FIG. 10, in which a power MOS transistor Tr1 configured in accordance with the present invention and a substrate bias circuit 50 are formed on an IC chip 46, with the power MOS transistor Tr1 driving an external load 44. This embodiment differs from that of FIG. 9 in that the substrate bias circuit 50 utilizes the fact that, when a reverse bias is applied to the substrate, the threshold voltage Vt of the power MOS transistor Tr1 is increased due to the substrate effect. Hence, the substrate bias circuit 50 can be used to control the value of Vt. Specifically, when the power MOS transistor Tr1 is in the OFF state (i.e., with 0 V applied as the gate voltage), a reverse bias is applied to the substrate (e.g., having a value of several pad volts, which is of positive polarity in the case of the N-MOS structure) causing the threshold voltage Vt of transistor Tr1 to become high. When transistor Tr1 is set in the ON state (e.g., with the gate voltage being 5 V), the substrate bias voltage is made 0 V, thereby lowering Ad the threshold voltage. In that way, the substrate bias circuit 50 is configured such as to apply a reverse bias voltage to the substrate only when the transistor Tr1 is in the OFF state, so that an optimized value of the threshold voltage Vt is maintained.

This operation of the embodiment of FIG. 10 is made possible due to the fact that, as described hereinabove, the substrate contact cells 14 of the power MOS transistor Tr1 are each connected to an electrode 15, which is separate from the source electrode 7, so that the substrate contact cells 14 can be coupled through the substrate potential-setting connecting lead 22 to a substrate bias circuit such as the circuit 50 of FIG. 10.

Figure 11:
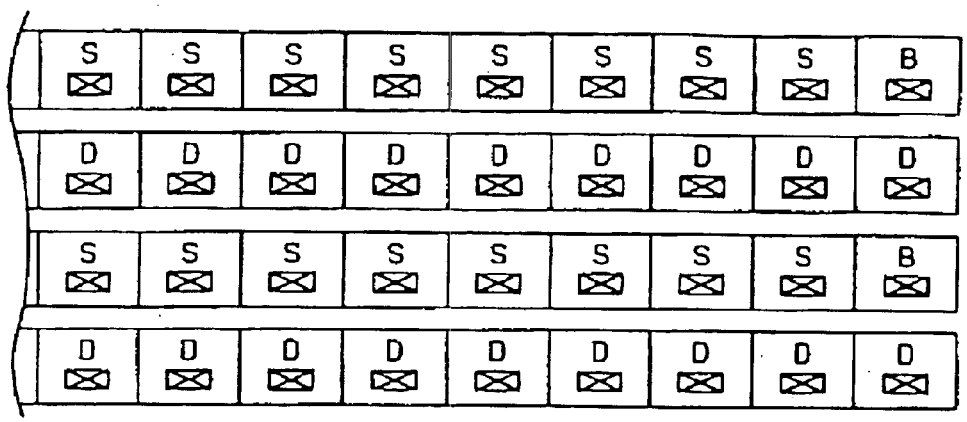
FIG. 11 is a plan view of a first alternative embodiment of a power MOS transistor, showing an arrangement of substrate contact cells in relation to source cells and drain cells.

With the first embodiment of a power MOS transistor described above, as shown in FIG. 2, a plurality of substrate contact cells B are arranged within each row of source cells, with each pair of substrate contact cells within a row of source cells being separated from one another by a plurality of source cells. An alternative arrangement of the substrate contact cells within each row of source cells is illustrated in the plan view of FIG. 11, in which the substrate contact cells B are located only at the outer ends of the respective rows of source cells, with no substrate contact cells being located in the interior of each row of source cells. This arrangement has the advantage that it is only necessary to supply the substrate bias voltage to positions at the outer ends of the rows of source cells.

Figure 12:
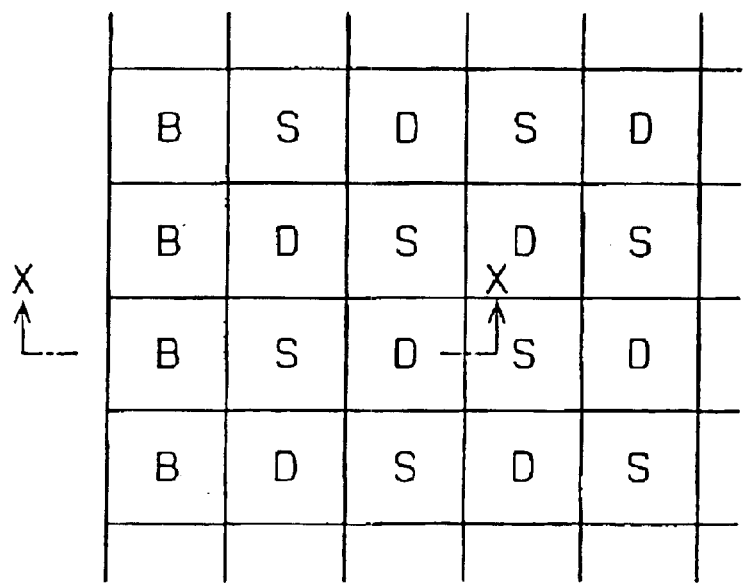
FIG. 12 is a plan view of a second alternative embodiment of a power MOS transistor, configured as a RESURF type of LDMOS transistor.
Figure 13:
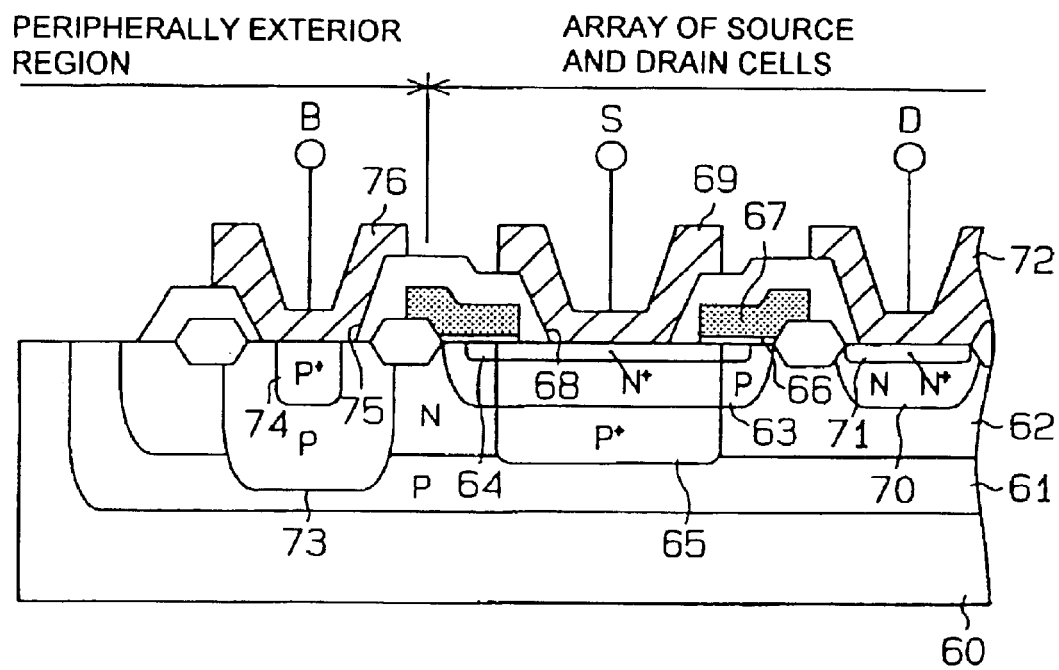
FIG. 13 is a cross-sectional view in elevation, taken through the line X—X in FIG. 12.

A further alternative configuration of the power MOS transistor of the first embodiment is illustrated in the plan view of FIG. 12 and the cross-sectional view in elevation shown in FIG. 13, taken through the line X—X in FIG. 12. This arrangement is applicable to a RESURF (reduced surface effect) type of mesh structure LDMOS device. Here, instead of providing substrate contacts at each of the source cells, as with the prior art, the substrate potential is set from the exterior of the transistor, through the P type region 61. More specifically, a P well 61 and an N well 62 are successively formed in the upper face of the substrate 60 by the double-diffusion process, and then the groups of source cells and drain cells are formed from the P type region 63, N$^+$ source region 64, and P$^+$ region 65. In FIG. 13, the channel region is formed from the P type region 63 and P$^+$ region 65. A gate insulation film portion 66 is formed upon at least a part of each of the regions 63 and 65. The N$^+$ region 64 is connected through the contact hole 68 to the source electrode 69. An N type region 70 and an N$^+$ region 71 are formed on uppermost layer portion of the N well 62, and the N$^+$ region 71 is connected to the drain electrode 72. The P type region 73 and P$^+$ region 74 are formed at the outer periphery of the group of drain and source cells. These body contact regions 73 and 74 are connected through the contact hole 75 to the substrate potential-setting electrode 76.

With the RESURF type of LDMOS transistor, each of the substrate contact cells (P type regions 73, 74) are connected through the P well 61, so that the structure described above is applicable to both a mesh configuration and a stripe configuration.

Figure 14:
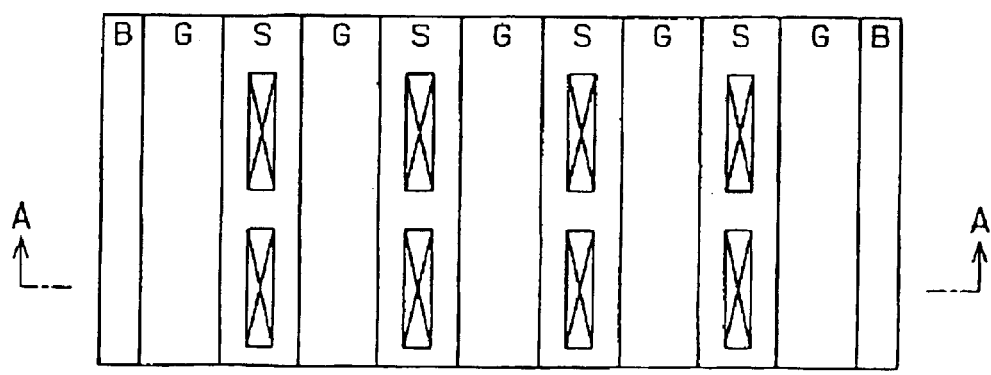
FIG. 14 is a plan view of a third alternative embodiment of a power MOS transistor, configured as a VDMOS transistor.
Figure 15:
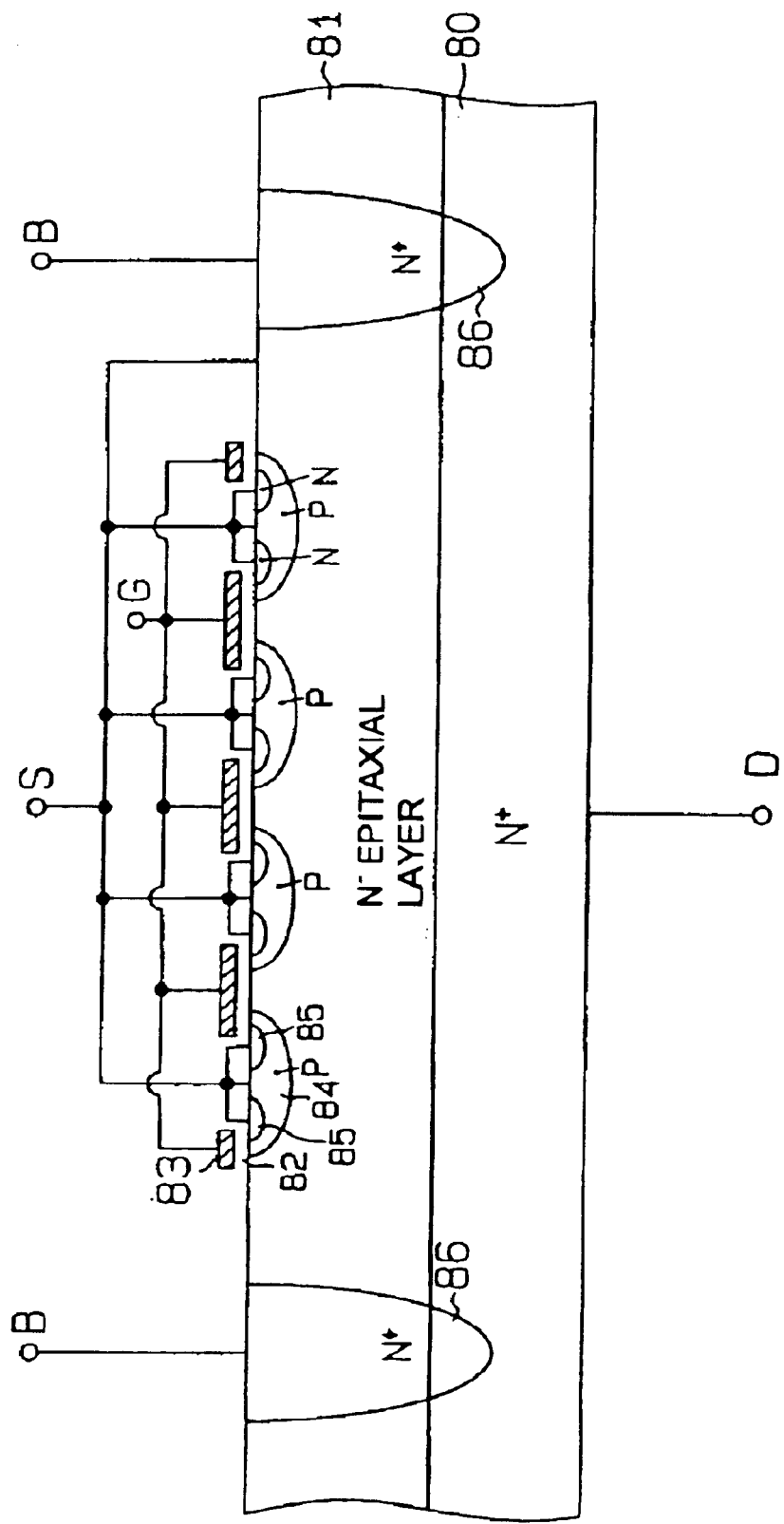
FIG. 15 is a cross-sectional view in elevation, taken through the line A—A in FIG. 14.

Furthermore the invention is equally applicable to a VDMOS (vertical double-diffused metal oxide semiconductor) FET, as illustrated in the plan view of FIG. 14 and the cross-sectional view in elevation shown in FIG. 15, taken through the line A—A in FIG. 14. With a VDMOS-FET in which the source portions have a stripe configuration, the invention enables the substrate potential to be set independently of the source potential, in the same way as described hereinabove for the embodiment of FIG. 1. Specifically, referring to FIG. 15, an $N^+$ type silicon substrate 80 which functions as a drain region has an N– silicon layer 81 formed thereon by epitaxial growth, with the N– silicon layer 81 having a lower concentration than the $N^+$ type silicon substrate 80. A polysilicon gate electrode 83 is disposed above the top surface of the N– silicon layer 81, separated from that surface by a gate oxide film 82. A channel P well 84 is formed in the upper surface of the N– silicon layer 81, extending to the outer periphery of the polysilicon gate electrode 83, while in addition $N^+$ regions 85 are formed in surface portions of the channel P well 84. In that way, the polysilicon gate electrode 83 is disposed over at least a part of the channel P well 84, separated therefrom by the gate oxide film 82. In addition, a deep $N^+$ region 86 is formed around the periphery of the source cell, extending from a surface layer portion of the $N^-$ silicon layer 81 to the $N^+$ silicon substrate 80. Furthermore, the deep $N^+$ region 86 is connected through a contact hole (not shown in the drawings) to a substrate potential-setting electrode (not shown in the drawings).

The invention is also applicable to other types of prior art MOS power transistors configuration in which substrate portions are set to a common potential of a plurality of source cells, for enabling the configuration to be modified to permit the substrate potential to be set independently of the source potential. A specific example is the IGBT (insulated gate bipolar transistor) configuration in which the emitter portions are formed in a stripe shape, and also the trench IGPT configuration in which the base portions (channel regions) are formed in common. If the invention were to be applied to an IGPT transistor, then the source electrode (source region) shown in FIG. 6 would become the emitter electrode (emitter region), while the drain electrode would become the collector electrode.

Figure 16:
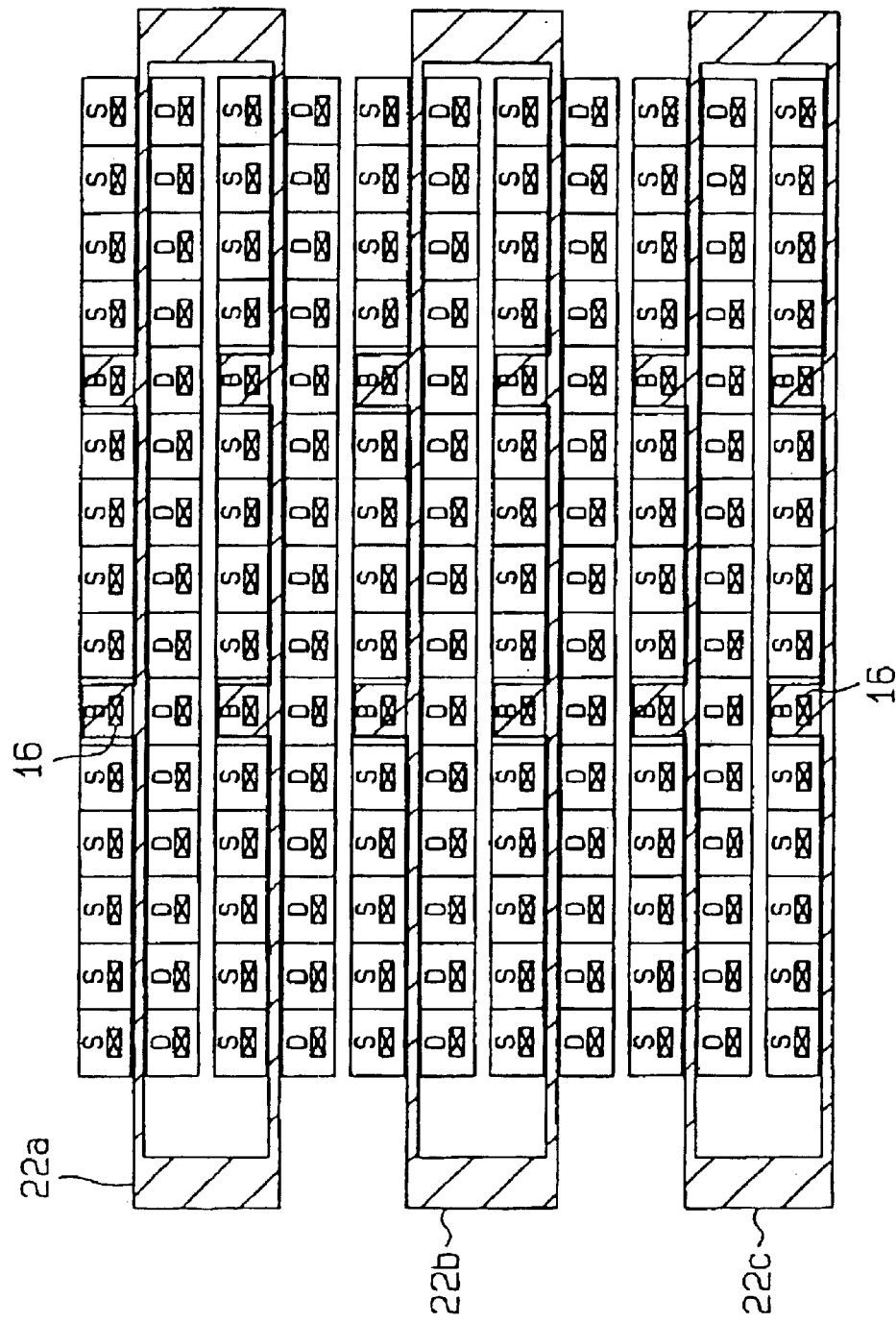
FIG. 16 is a plan view of a fourth alternative embodiment of a power MOS transistor, whereby a plurality of sets of transistor elements can be selectively activated.

Furthermore, in the case of a stripe configuration power MOS transistor (such as a conventional LDMOS or VDMOS transistor), the invention can be used to apply respectively different levels of substrate potential to different regions of the power MOS transistor, i.e., by providing respectively separate substrate potential-setting electrodes for each of these regions. As a specific embodiment, referring to FIG. 16, substrate potential-setting connecting leads 22a, 22b and 22c are respectively formed, with each of these being connected to each of the substrate contact cells B of m corresponding rows of source cells, where m is an integer which is equal to 2 in the example of FIG. 16. That is to say, in FIG. 16, each of the substrate potential-setting connecting leads 22a, 22b and 22c is connected to the substrate contact cells B which lie within two specific rows of source cells.

Figure 17:
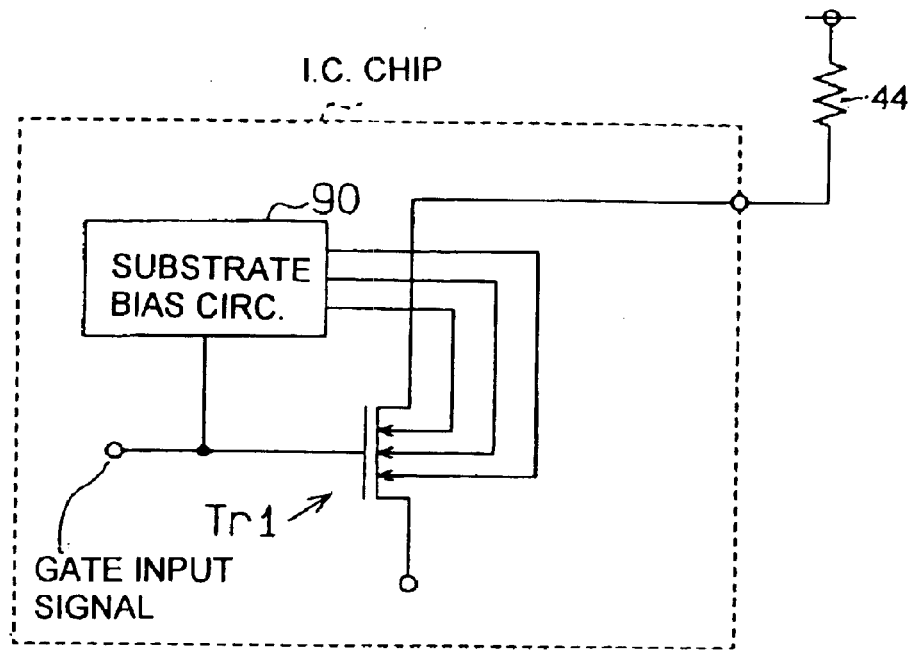
FIG. 17 is a circuit diagram of a substrate bias circuit for applying respectively separate substrate bias voltages to the sets of transistor elements in the embodiment of FIG. 16.

An example of utilizing such a power MOS transistor configuration is illustrated in the circuit diagram of FIG. 17.

Here, a substrate bias circuit 90 can be controlled (e.g., by a control input signal, not shown in the drawing) to apply respectively independent reverse bias voltages to the substrate potential-setting connecting leads 22a, 22b and 22c of a power MOS transistor Tr1. The level of reverse bias voltage applied to a substrate potential-setting electrode is made sufficiently high as to set all of the transistor elements in the corresponding region of the power MOS transistor unconditionally in the OFF state. As a result, the portions of the transistor Tr1 corresponding to the pairs of rows of source cells whose substrate potentials are respectively set by the substrate potential-setting connecting leads 22a, 22b and 22c can, in effect, function as respective separate transistors which are connected in parallel and can be selectively deactivated.

Figure 18:
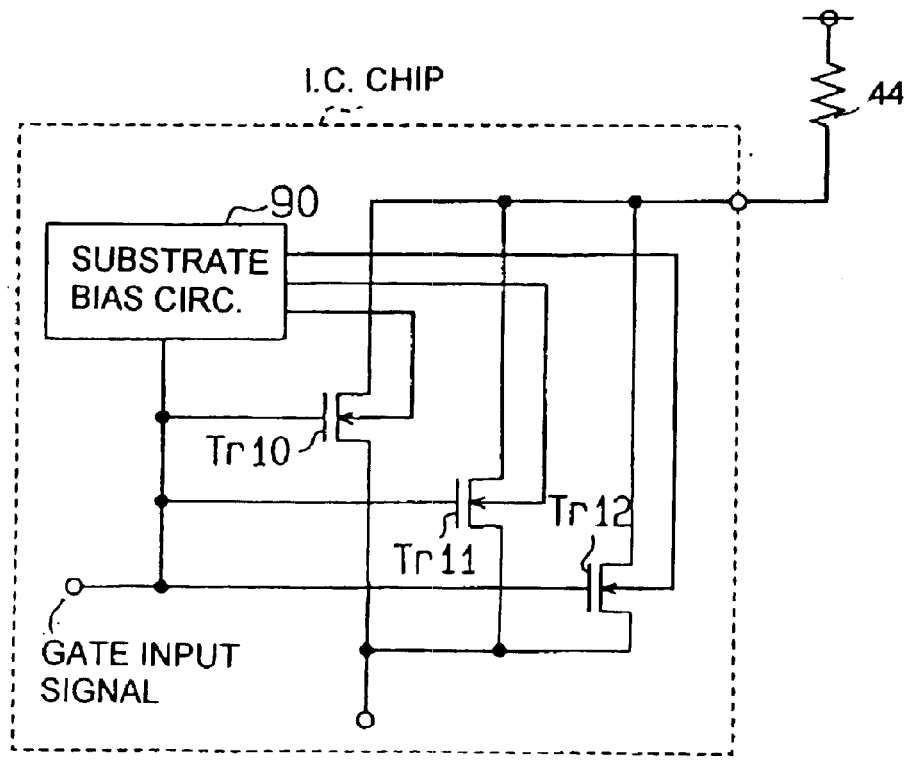
FIG. 18 is a conceptual circuit diagram for describing the operation of the circuit of FIG. 17.

This is illustrated in the conceptual circuit diagram of FIG. 18, in which the transistors Tr10, Tr10 and Tr12 respectively corresponding to those portions of the power MOS transistor Tr1 which can be respectively independently selected to be enabled to be controlled by the gate input signal or to be unconditionally held in the OFF state by means of the bias voltages applied from the substrate bias circuit 90 to the substrate potential-setting connecting leads 22a, 22b and 22c.

For example if the gate voltage is set as 5 V, and the substrate potential of each of these transistors Tr10, Tr11 and Tr12 is set to a sufficiently high level of reverse bias, then each of these will be set in the OFF state. In that condition, if a substrate potential of 0 V is applied to the transistor Tr12 it will be set in the ON state, so that a specific level of current will flow through that transistor Tr12. In that way, by providing a plurality of body contact regions within the area in which the power MOS transistor Tr1 is formed, the substrate bias circuit 90 can function as a substrate bias control circuit which applies ON/OFF control respectively independently to each of the transistors Tr10, Tr11, Tr12. Each of these transistors corresponds to a set of body contact regions 14, which each have the configuration illustrated in the cross-sectional views of FIGS. 6 and 7.

The invention has been described in the above for the case of an N-channel LDMOS type of power MOS transistor, however it is equally applicable to the P-channel LDMOS configuration.

Figure 19:
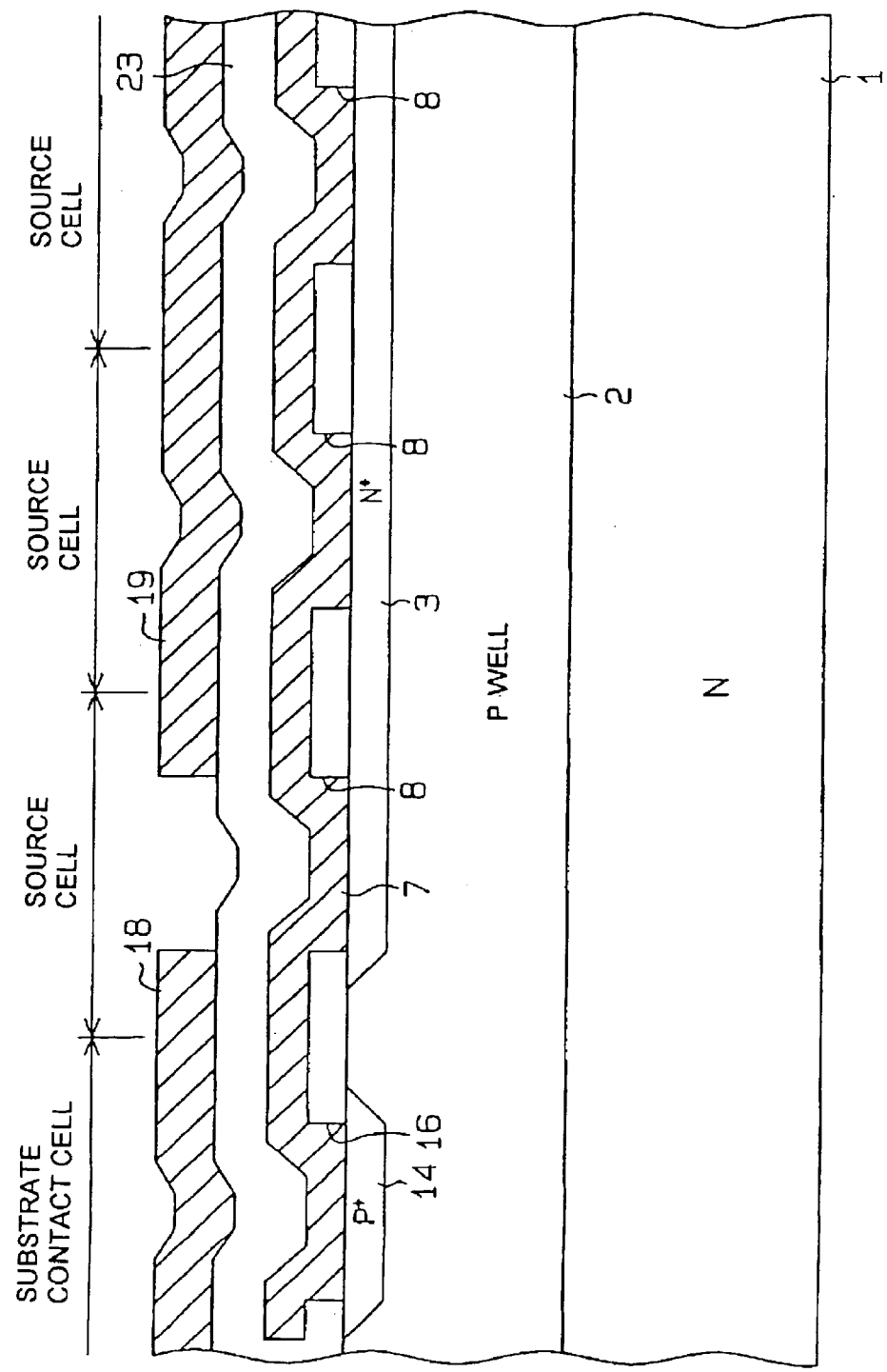
FIG. 19 is a cross-sectional view in elevation of an alternative embodiment of a power MOS transistor, whereby the substrate potential-setting electrodes of substrate contact cells are configured in common with drain electrodes.
Figures 20, 21:
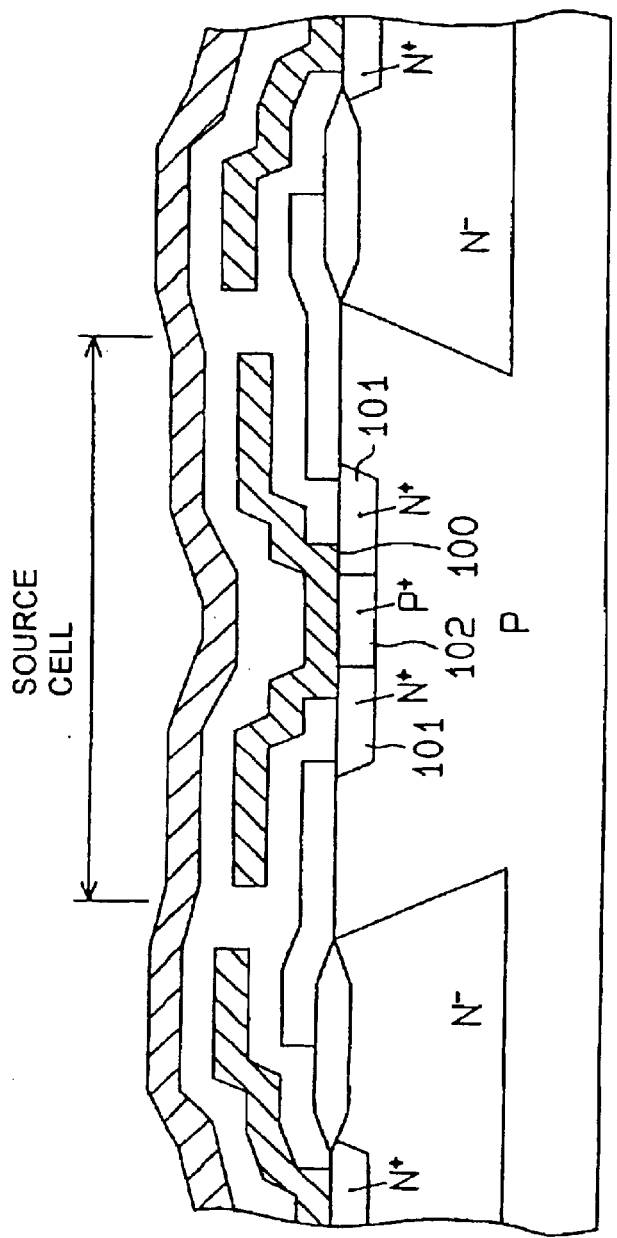
FIG. 20 is a diagram for illustrating an arrangement of drain cells and source cells in a prior art type of power MOS transistor.
FIG. 21 is a cross-sectional view in elevation of a first example of a prior art type of power MOS transistor.

Furthermore with the power MOS transistor embodiment described above referring to FIGS. 1 to 8, the electrodes of the substrate contact cells are separate from the source electrodes (as shown in FIG. 8), so that the substrate potential can be set independently of the source potential. However the invention is equally applicable to a configuration in which (e.g., in each row of source cells) a single electrode is used in common for the source cells and the substrate contact cells, as illustrated in the cross-sectional view of FIG. 19 (in which the source electrode 7 also serves the function of the substrate potential-setting electrode 15 shown in FIG. 7) so that the substrate potential and source potential are identical. However the advantage of a substantial reduction in overall size of the region in which the power MOS transistor is formed on an IC chip (due to the reduction in the amount of area occupied by each source cell, by comparison with the prior art, as described hereinabove) is still obtained with such a configuration.

Figure 30:
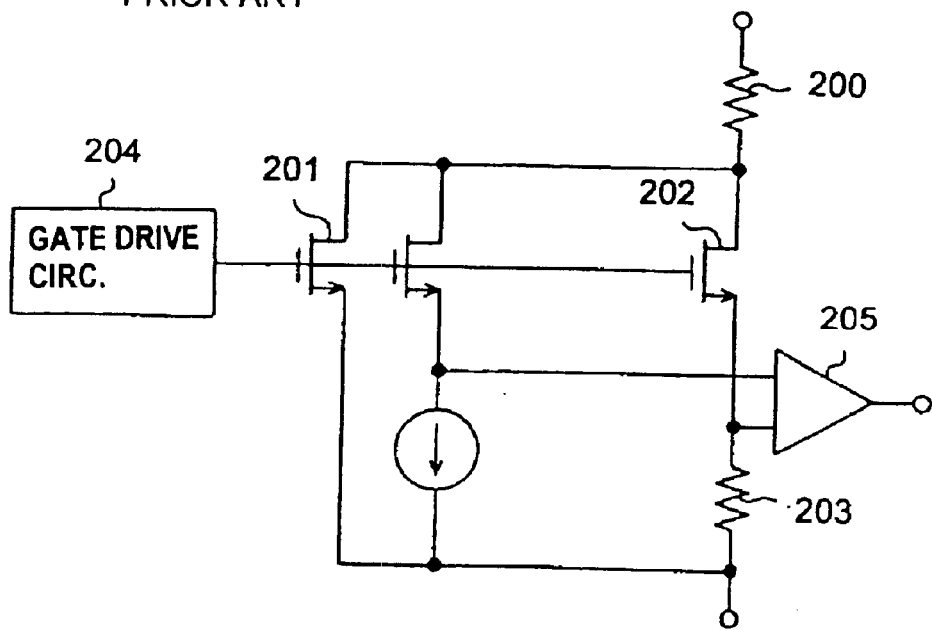
FIG. 30 is a circuit diagram of an example of a prior art type of overcurrent limiting control circuit for a power MOS transistor.

As described hereinabove referring to FIG. 30, prior art methods of applying control to prevent excessive current flow through a power MOS transistor cannot provide a requisite level of accuracy, since they cannot derive an output signal value which accurately represents the level of drain current through the power MOS transistor under all conditions of operation, i.e., whereby the ratio of that output signal value to the value of drain current of the power MOS transistor is held constant, both when that transistor is operating in a switching transition between the OFF and ON states and when it is operating in the ON state. An embodiment will be described in the following which is a combination of a power MOS transistor, configured in accordance with the present invention as described hereinabove, and a circuit for deriving an output signal value which is in a fixed ratio to the level of drain current through the power MOS transistor and for applying that output signal value to implement over-current limiting for the power MOS transistor. This embodiment is described assuming the use of N-MOS configuration FETs, so that the term "increase in substrate bias voltage" (for the purpose of effecting an increase in threshold voltage) is to be understood as signifying an increase of a positive-polarity voltage.

Figure 23:
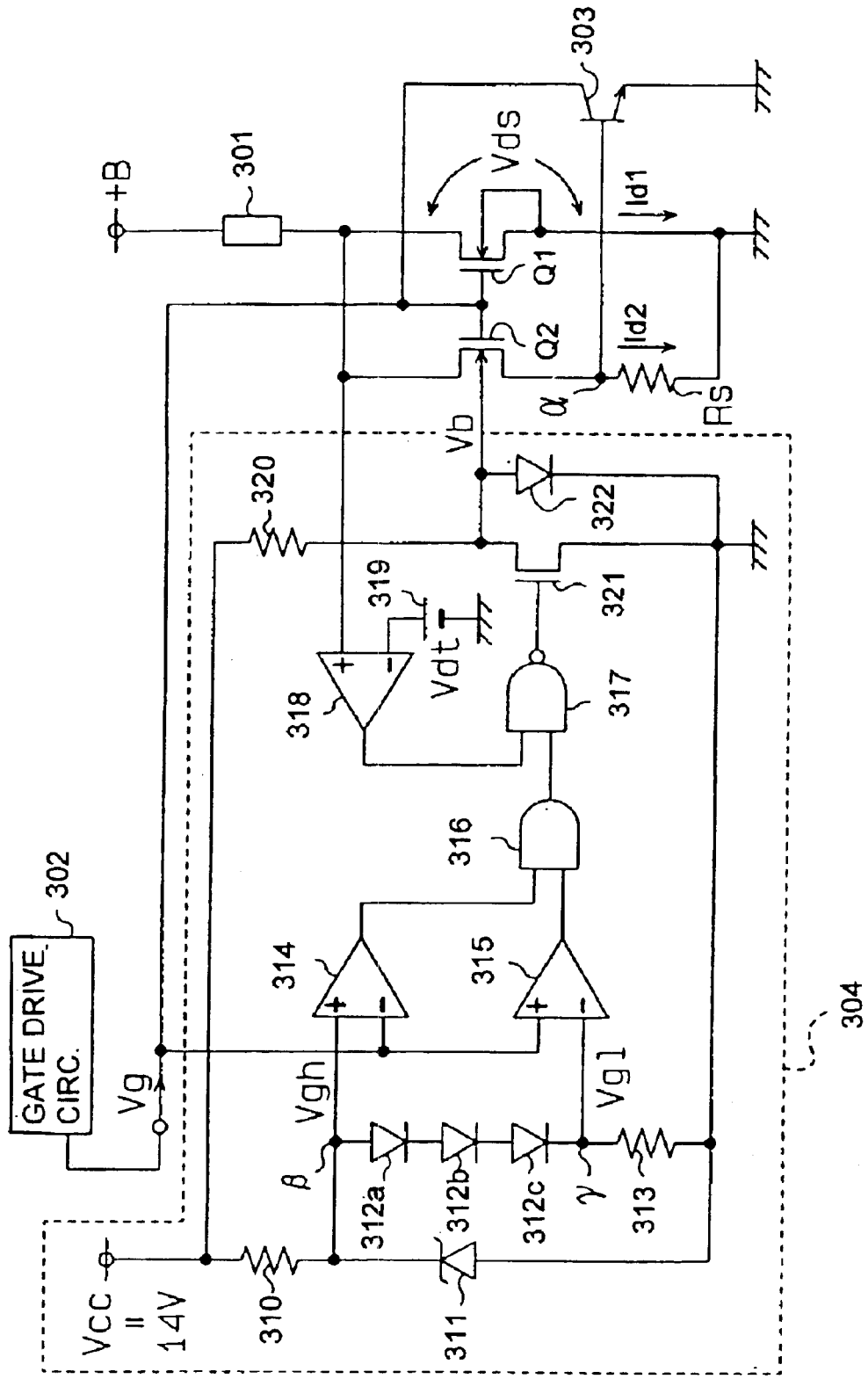
FIG. 23 is a circuit diagram of an overcurrent limiting control circuit for a power MOS transistor, utilizing a substrate potential control circuit.

FIG. 23 is a circuit diagram of this embodiment, in which a power MOS transistor Q1 is connected in series with a load 301 between a power supply voltage +B and ground potential. The substrate of the power transistor Q1 is also connected to ground potential. Thus, the power MOS transistor Q1 may be configured for example as described hereinabove referring to FIG. 19, in which source electrode 7 also functions as an electrode in each of respective substrate contact cells, along a row of source cells, since with this embodiment it is assumed that the substrate of the power MOS transistor Q1 is held at the source potential. A MOSFET Q2, referred to in the following as the sensing transistor, formed on the same chip substrate as the power MOS transistor Q1, is connected in series with a resistor Rs, referred to in the following as the sensing resistor, between the source and drain terminals of the power transistor Q1. The gate terminals of each of the power transistor Q1 and sensing transistor Q2 are connected in common to receive a gate input signal Vg which is produced from a gate drive circuit 302, and drives each of these transistors to the aforementioned ON and OFF states.

The sensing transistor Q2 is configured to enable the substrate potential of that transistor to be set independently of the source potential, and can be formed with a similar structure to that described hereinabove for example referring to FIGS. 1 to 8 (for example, within a part of the substrate region in which the power MOS transistor is formed) but using only a small number of cells (i.e., at least one source cell, drain cell, gate electrode and substrate contact cell), and having a source electrode that is not connected to the source electrodes of the power transistor Q1, and also having a substrate potential-setting electrode (e.g., corresponding to the electrode 15 in FIG. 7) that is not connected to other electrodes. The sensing transistor Q2 needs only to be capable of passing a drain current of the order of several milliamperes, as opposed to the very high level of drain current which can be passed by a power MOS transistor that is formed of a very large number of source and drain cells.

As described hereinabove referring to the prior art example of FIG. 30, if no effect were produced by current flow through the sensing resistor Rs, the ratio of the respective current flow values through the power transistor Q1 and sensing transistor Q2 would be constant, under varying levels of current flow (and hence, of drain-to-source voltage) through these transistors, so that the voltage drop developed across the sensing resistor Rs could be used as a value which is accurately indicative of the level of drain current through the power transistor Q1.

A bipolar NPN transistor 303, functioning as a current-limiting transistor controlled in accordance with the voltage drop across the sensing resistor Rs, is connected between the gate terminals of the power transistor Q1 and sensing transistor Q2 and ground potential, with the base electrode of transistor 303 connected to the junction of the source terminal of the sensing transistor Q2 and the sensing resistor Rs, with that junction point being designated as α. When the voltage drop across the sensing resistor Rs exceeds a predetermined level, the current limiting transistor 3 is driven into saturation, so that the gate potential of the power transistor Q1 and sensing transistor Q2 is lowered substantially, to thereby limit the current which flows through the power transistor Q1 from the load 301.

A substrate potential control circuit 304 serves to adjust the substrate potential of the sensing transistor Q2, as described in the following. The substrate potential control circuit 304 includes a resistor 310 connected in series with a zener diode 311 between a power supply voltage Vcc, which might typically be approximately 14V, and ground potential. The zener diode 311 has a voltage drop of 6 V, so that a reference voltage designated as Vgh appears at the junction between the resistor 310 and zener diode 311, with that junction point being designated as β. Diodes 312a, 312b, 312c are connected in series with a resistor 313, across the zener diode 311. Each of the diodes 312a, 312b, 312c has a forward voltage drop of approximately 0.6 V, to produce a total voltage drop of 1.8 V. As a result, a reference voltage designated as Vgl and having the value 4.2 V appears at the junction between the resistor 313 and the diodes 312a, 312b, 312c, with that junction point being designated as γ.

The Vgh junction point μ is connected to the non-inverting input terminal of a comparator 314, while the Vgl junction point γ is connected to the inverting input terminal of a comparator 315. The gate input signal Vg is applied to the inverting input terminal of the comparator 314 and to the non-inverting input terminal of the comparator 315. As a result, when the gate input signal Vg is higher than Vgl (i.e., 4.2 V) the output of the comparator 315 goes to the logic H level (referred to in the following simply as the H level) while when the gate input signal Vg is lower than Vgh (i.e., 6 V) the output of the comparator 314 goes to the H level.

The respective output terminals of the comparators 314, 315 are connected to the input terminals of a 2-input AND gate 316, so that when the level of the gate input signal Vg is higher than Vgl and lower than Vgh, the output of AND gate 316 is at the H level. The output terminal of the AND gate 316 is connected to an input terminal of a 2-input NAND gate 317.

The respective drain terminals of the power transistor Q1 and sensing transistor Q2 are connected to the non-inverting input terminal of a comparator 318, while the inverting input terminal of comparator 318 is connected to a reference voltage source 319. The reference voltage source 319 generates a DC reference voltage Vdt. Referring to the characteristic diagram of FIG. 26, this shows the relationships between the drain current Id and drain-to-source voltage Vds of the sensing transistor Q2 as the gate input signal Vg varies between the reference levels Vgh and Vgl. As indicated, Vdt is defined by the point at which the load line corresponding to the value of the sensing resistor Rs (drawn to intersect the Id-Vds characteristic that corresponds to Vgs being slightly above Vgl, at the point P where that characteristic changes between the region of linear operation and the region of saturation operation) intersects with the Vds axis (i.e., Id=0). The comparator 318 compares the drain-to-source voltage Vds with the reference potential Vdt, and if Vds is higher than Vdt, produces an output at the H level.

The output terminal of the comparator 318 is connected to the other input terminal of the NAND gate 317. Thus, the output of the NAND gate 317 will be at the L level so long as the condition is met that:

(a) the gate input signal Vg is within the range of potentials from Vgl to Vgh (i.e., is higher than the minimum value whereby the sensing transistor Q2 is set in the ON state in the absence of applied substrate bias voltage), and (b) the level of the gate input signal Vg is higher than the reference voltage Vdt.

Otherwise, the output of the NAND gate 317 is at the H level.

A resistor 320 and transistor 321 (assumed here to be a FET) are also connected in series between the power supply voltage Vcc and ground potential, with the gate electrode of the transistor 321 connected to the output from the NAND gate 317. Thus when the output of the NAND gate 317 goes to the H level, the transistor 321 is set in the ON state, and when the output of NAND gate 317 goes to the L level the transistor 321 is set in the OFF state. A diode 322 is connected in parallel with the drain and source terminals of the transistor 321, with the drain terminal connected to the substrate potential-setting electrode of the sensing transistor Q1. The diode 322 is oriented for forward current flow via the resistor 320, with a forward voltage drop of approximately 0.8 V. Thus when the transistor 321 goes from the OFF to the OFF state, the substrate potential of the sensing transistor Q2 is increased from 0 V to 0.8 V. The substrate potential of the power transistor Q1 however is fixed at the source potential, i.e., 0 V.

The operation of this embodiment will be described referring first to the timing chart of FIG. 24, which shows the respective waveforms of the gate input signal Vg, the drain-to-source voltage Vds of the power transistor Q1, the drain current Id1 of the power transistor Q1, the drain current Id2 of the sensing transistor Q2, and the substrate potential Vb of the sensing transistor Q2.

Figure 24:
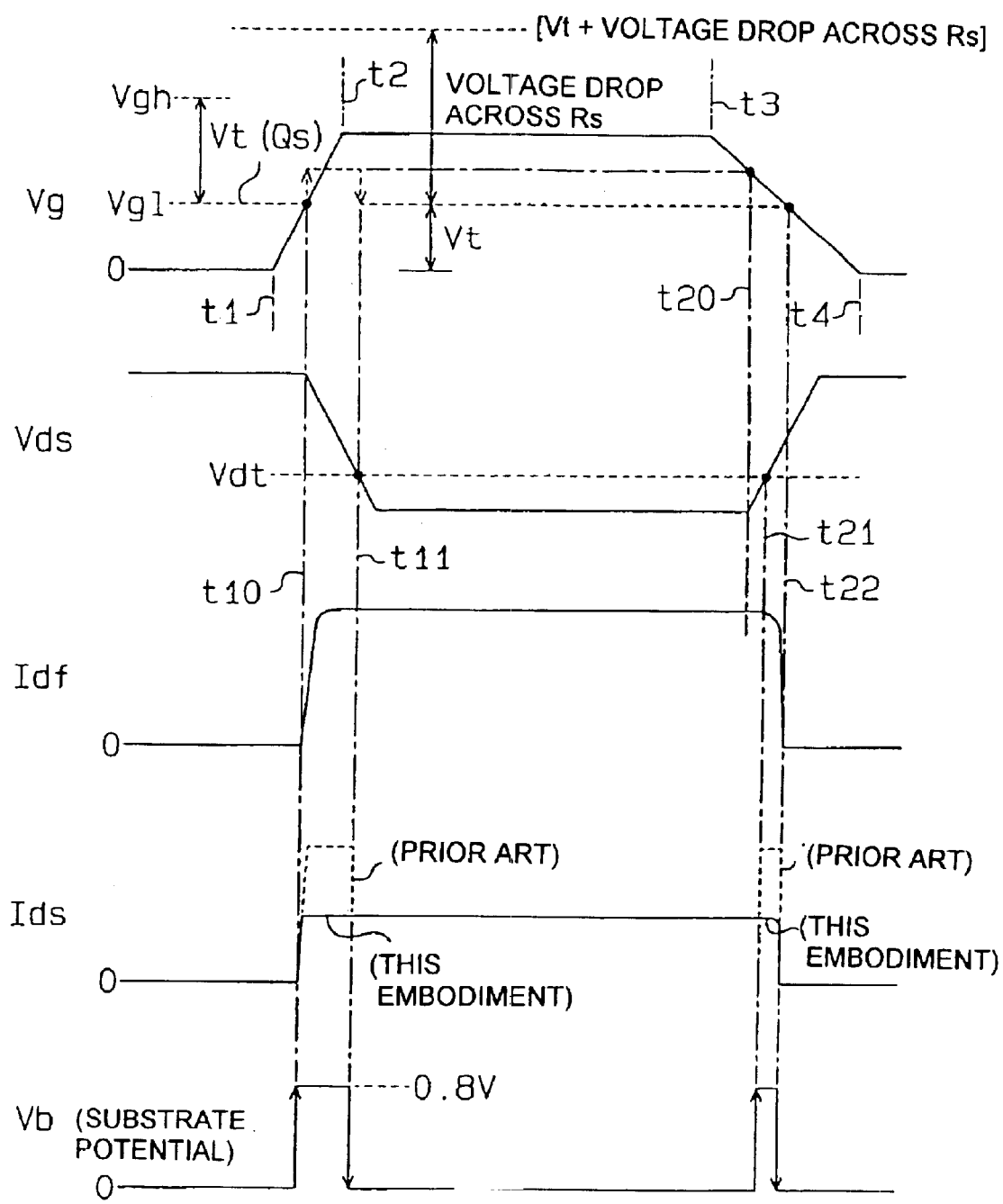
FIG. 24 is a timing diagram for use in describing the operation of the circuit of FIG. 23.

As shown in FIG. 24, the gate input signal Vg begins to rises from the 0 V level at time point t1, (with zero drain current flowing through each of the transistors Q2, Q1), reaches a predetermined value (i.e., which is sufficiently high to drive the transistor Q1 fully into the ON state) at time point t2, remains at that predetermined value until time point t3 and then begins to fall, and reaches 0 V at the time point t4.

If a prior art circuit configuration were to be utilized, with the substrate potential of the sensing transistor Q2 being held fixed, then the drain current Id2 of the sensing transistor Q2 would vary as indicated by the broken-line portions of the Id2 waveform. The reason for this can be understood by referring to FIG. 25, which illustrates the relation between drain current Id and drain-to-source voltage Vds of the sensing transistor Q2 (with a level of gate voltage applied which is higher than the threshold voltage Vt of that transistor) in the case of the prior art. The characteristic shown in FIG. 25 can be divided into two regions, i.e., a linear region in which Vds is low and the relationship between drain current and Vds is approximately linear (corresponding to the ON condition of the transistor), and a saturation region in which Vds is high and the drain current is determined only by the gate voltage, independent of Vds (corresponding to the condition during a switching transition between the ON to OFF or OFF to ON states of the transistor). Within the switching transition intervals between the time points t1 and t2 and between t3 and t4 in FIG. 24, the sensing transistor Q2 operates in the saturation region of the characteristic shown in FIG. 25. Within the interval between t2 and t3, the sensing transistor Q2 operates in the linear region shown in FIG. 25.

With a prior art method therefore, the drain current Id2 through the sensing transistor Q2 is reduced, during each interval in which that transistor is set in the ON state and so is operating in the linear region (i.e., is reduced due to the reduction in the drain-to-source voltage of that transistor which results from the voltage drop across the sensing resistor Rs) by comparison with the level of that current immediately prior to entering the linear region, or immediately after leaving that region. That is, during each transition of the sensing transistor Q2 between the ON and OFF states, the drain current of that transistor will attain a higher level than that during the ON state. Thus, the waveform of that drain current Id2 will become relatively increased, as indicated by the broken-line portions shown in FIG. 24, immediately before and immediately after the end of each ON interval of the sensing transistor Q2.

Figure 25:
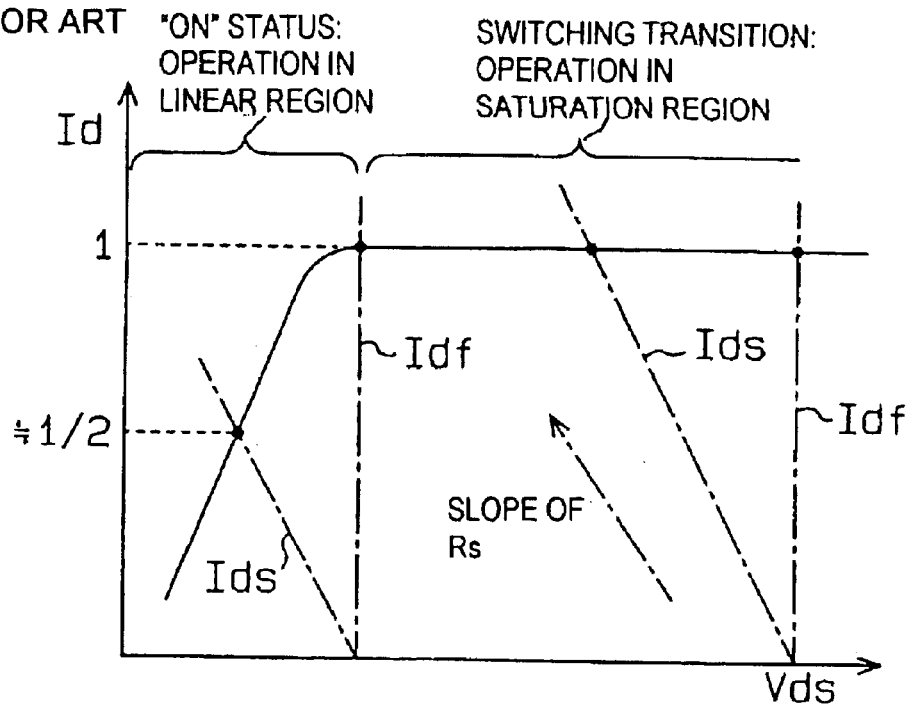
FIG. 25 is a MOSFET operating characteristic diagram, for use in describing a disadvantage of a prior art method of monitoring current flow through a power MOS transistor.

This can be further understood by referring to the load lines shown in FIG. 25, in which it is assumed that the value of the sensing resistor Rs is such that during operation in the linear region, the drain current of the sensing transistor Q2 is reduced to one half of the value of that current within the saturation region. The essential concept of this embodiment is that compensation for that reduction of drain current of the sensing transistor is achieved by applying a substrate reverse bias voltage to increase the threshold voltage of that transistor during each switching transition interval, by an amount which will reduce the level of drain current (during that interval) to become substantially identical to the level of drain current that flows during operation in the linear region (i.e., the ON state of the sensing transistor) with the substrate bias voltage removed.

For example, assuming the case illustrated in FIG. 25, a substrate bias voltage would be applied to the sensing transistor (during operation of that transistor in the saturation region, i.e., switching transition interval) such as to increase the threshold voltage to a level whereby the drain current of the sensing transistor is reduced to one half of the value which would flow in the absence of the substrate bias voltage.

With the embodiment shown in FIG. 23, within the intervals t1 to t2 and from t3 to t4 of FIG. 24, in which operation in the saturation region occurs, the substrate potential Vt of the sensing transistor Q2 is changed from 0 V to 0.8 V during each of the intervals between t10 to t11 and between t21 to t22. This has the effect of increasing the threshold value of transistor Q2 by approximately 0.3 V. Assuming that the value of the sensing resistor Rs is such that the condition shown in FIG. 25 applied, that increase in threshold voltage would result in the level of drain current of transistor Q2 during each of the aforementioned intervals being reduced to one half of the value of that drain current which would flow if the threshold voltage were to be left unchanged.

As a result, the ratio of the respective drain currents of the sensing transistor Q2 and power transistor Q1 can be maintained at a substantially constant value, during operation of these transistors both in the switching transition (saturation operating region) condition and in the fully ON (linear operating region) condition.

The relative increase in the level of that drain current Id2 of the sensing transistor Q2 during each of the intervals between t10 to t11 and between t21 to t22, which occurs in the prior art as described above, can thereby be eliminated.

In the above it is assumed that the voltage drop across the sensing resistor Rs, when the sensing transistor Q2 is operating in the ON state, is approximately 0.3 V. In that case, the aforementioned increase in the substrate bias voltage of 0.8 V may be appropriate for producing an increase in the threshold value Vt of the sensing transistor Q2, during operation in the switching intervals (t1 to t2, t3 to t4), by 0.3 V. However the actual value of bias voltage Vb that is appropriate will depend upon the device characteristics of the transistor which is used as sensing transistor Q2 (and of course upon the value of the sensing resistor Rs), and could by set appropriately by adjusting the level of forward current through the diode 322, or increasing the number of diode stages, for example.

Figure 26:
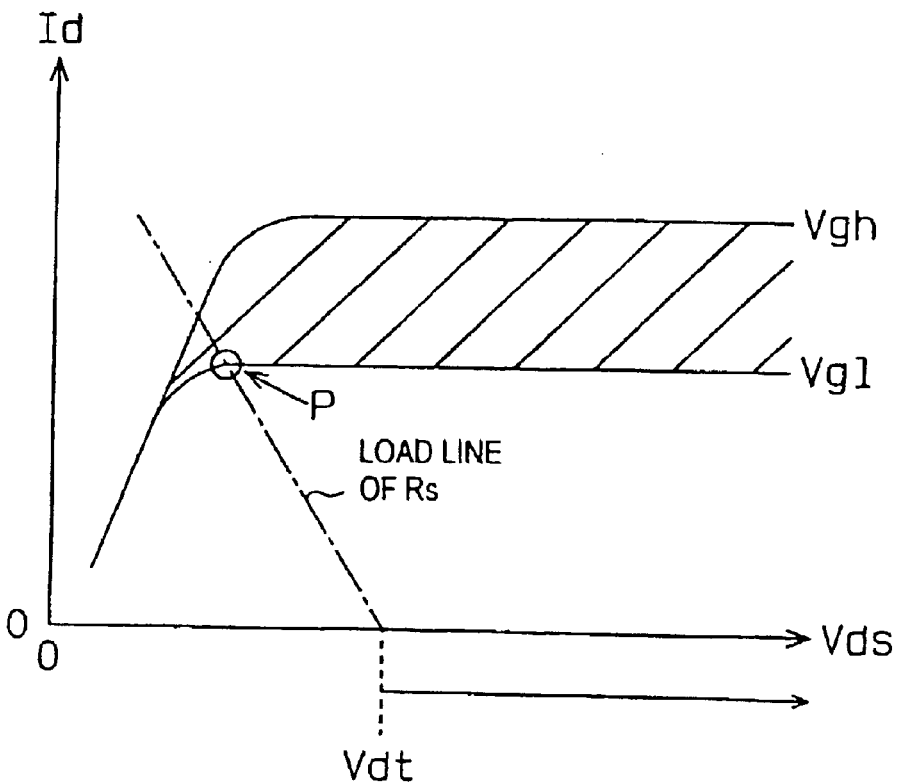
FIG. 26 is a MOSFET operating characteristic diagram for use in describing the operation of the circuit of FIG. 23.

FIG. 26 illustrates the conditions for establishing the value Vdt of the drain-to-source voltage Vds of the power MOS transistor Q1 at which the sensing transistor Q2 moves from operation in the saturation region into operation in the linear region (i.e., end of switching transition interval) or from operation in the linear region into operation in the saturation region (i.e., end of ON state interval). As illustrate, the level Vdt corresponds to the intersection of the load line for the sensing resistor Rs with the Vds axis in FIG. 26, when that load line is drawn to pass through the point P at which the Id-Vds characteristic of the sensing transistor Q2 (with a gate voltage exceeding Vgl applied to the transistors Q1, Q2)) changes between the linear region and the saturation region. That is to say, Vdt is the sum of the voltage drop which occurs across the sensing resistor Rs when the sensing transistor Q2 enters the ON state and the drain-to-source voltage of that transistor when it enters the ON state.

Referring again to FIG. 24, the gate input voltage Vg begins to rise (from 0 V) at the time point t1, and reaches the threshold voltage Vt at t10, whereupon the transistors Q2, Q1 enter the ON state, so that the currents Id2, Id1 each begin to rise, while at the same time the drain-to-source voltage Vds of the power transistor Q1 begins to fall. At the same time, as a result of Vg reaching the level Vgl (i.e., 4.2 V), the output of the comparator 315 goes to the H level, so that the output of the AND gate 316 goes to the H level. Furthermore when the gate input voltage Vg exceeds the value Vdt, the output of the comparator 318 goes to the H level. Hence, the output of the NAND gate 317 goes to the L level, and the transistor 321 is set in the OFF state, whereby the substrate potential of the sensing transistor Q2 is changed from ground potential (0 V0 to approximately 0.8 V, i.e. the value of forward voltage drop across the diode 322.

Subsequently, when Vds reaches the level Vdt, at the time point t11, the output of the comparator 318 goes to the L level, and hence the output of the NAND gate 317 goes to the H level. The transistor 321 is thereby set in the ON state, so that the substrate potential Vb is returned to ground potential (0 V).

As a result of the increase in the substrate potential Vb during the interval between time points t10 to t11 in FIG. 24, the level of current Id2 which flows in the sensing transistor Q2 during that interval is reduced, by comparison with a prior art method in which the substrate potential of transistor Q2 is held unchanged. The reduction of Id2 is such that the waveform of Id2 during that interval between time points t10 to t11 becomes substantially identical to that of the drain current Id1 of transistor Q1.

At the time point t3, the gate input voltage Vg begins to fall, and at t20, each of the drain currents Id2 and Id1 begin to fall, while at the same time Vds begins to rise. Subsequently, at t21, when Vds reaches the value Vdt, the output of the comparator 318 goes to the H level. In addition, at that time, since the gate input voltage Vg is higher than the threshold voltage of the sensing transistor Q1 (in the absence of the substrate bias voltage), i.e., is within the range Vgl to Vgh, the output of the AND gate 316 goes to the H level, so that the output of the NAND gate 317 goes to the L level, and the transistor 21 is thereby set in the OFF state. As a result, the substrate potential Vb of the sensing transistor Q2 is changed from ground potential to 0.8 V (the voltage drop across diode 322), so that the substrate bias voltage is applied to the sensing transistor Q2.

At time point t22, the gate input voltage Vg reaches the reference level Vgl, so that the output of the comparator goes to the L level, and hence the output of the NAND gate 317 goes to the H level. The transistor 321 is thereby set in the ON state. As a result, the substrate potential Vb of the sensing transistor Q2 is returned to ground potential (0 V), i.e., the substrate bias voltage ceases to be applied to the sensing transistor Q2.

As a result of the increase in substrate potential of the sensing transistor Q2 in the interval between t21 to t22, the level of drain current Id2 of transistor Q2 is reduced, by comparison with the level which would flow in the case of a prior art method (in which the substrate potential is held unchanged), so that the waveform of Id2 within that interval is substantially identical to that of the drain current Id1 of the power transistor Q1.

It can thus be understood that if appropriate values are established for Vb and Vdt in relation to the value of Rs and the operating characteristics of the sensing transistor Q2, the ratio of Id1 to Id2 can be held substantially constant during both switching transitions and during operation of transistors Q1, Q2 in the fully ON state, and hence the voltage developed across the sensing resistor Rs can be utilized to accurately monitor the level of the drain current Id1 of the power transistor Q1, for the purpose of applying overcurrent limiting to the current which flows in the load 301.

It should be noted that the invention is not limited to the particular circuit arrangement shown in FIG. 23. As can be understood from the above description, the essential requirements for that circuit are:

(a) the circuit must monitor the drain-to-source voltage Vds of the power transistor, to determine whether that is above or below the aforementioned value Vbt (i.e., the value at which the sensing transistor changes between the linear region and saturation region), and (b) while Vds is above Vbt, a substrate bias voltage must be applied (for at least the duration of each interval in which the sensing transistor is operating in the linear region) such as to increase the threshold voltage level of the sensing transistor Q2 by an appropriate amount.

It should also be noted that the invention is not limited to use of a diode 322 to define the value of substrate bias Vb that is applied to the sensing transistor Q2, and that other arrangements for applying such a bias voltage could be envisaged.

Figure 27:
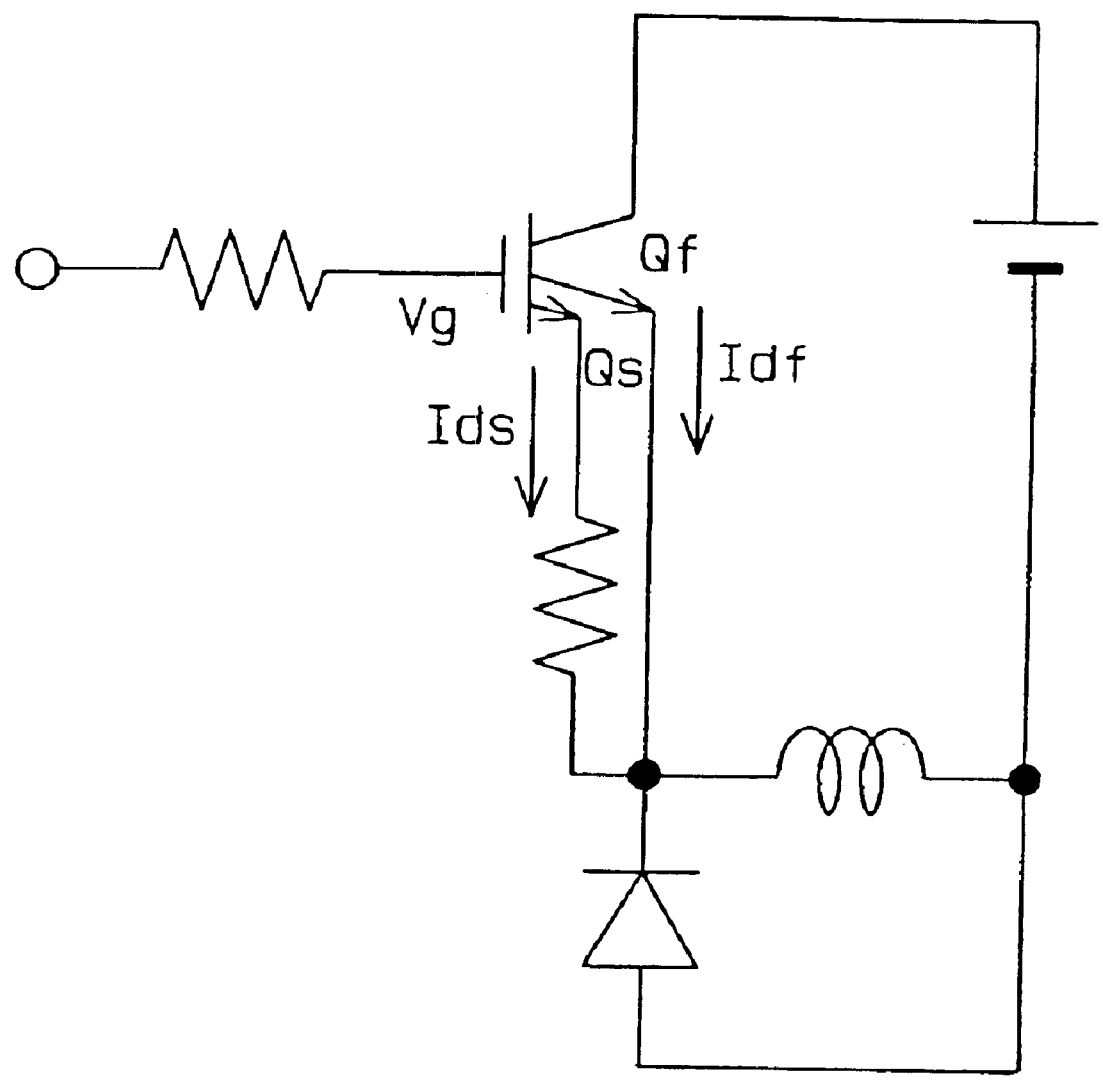
FIG. 27 is a circuit diagram of a test circuit used in measurements of an IGBT type of power transistor.
Figure 28:
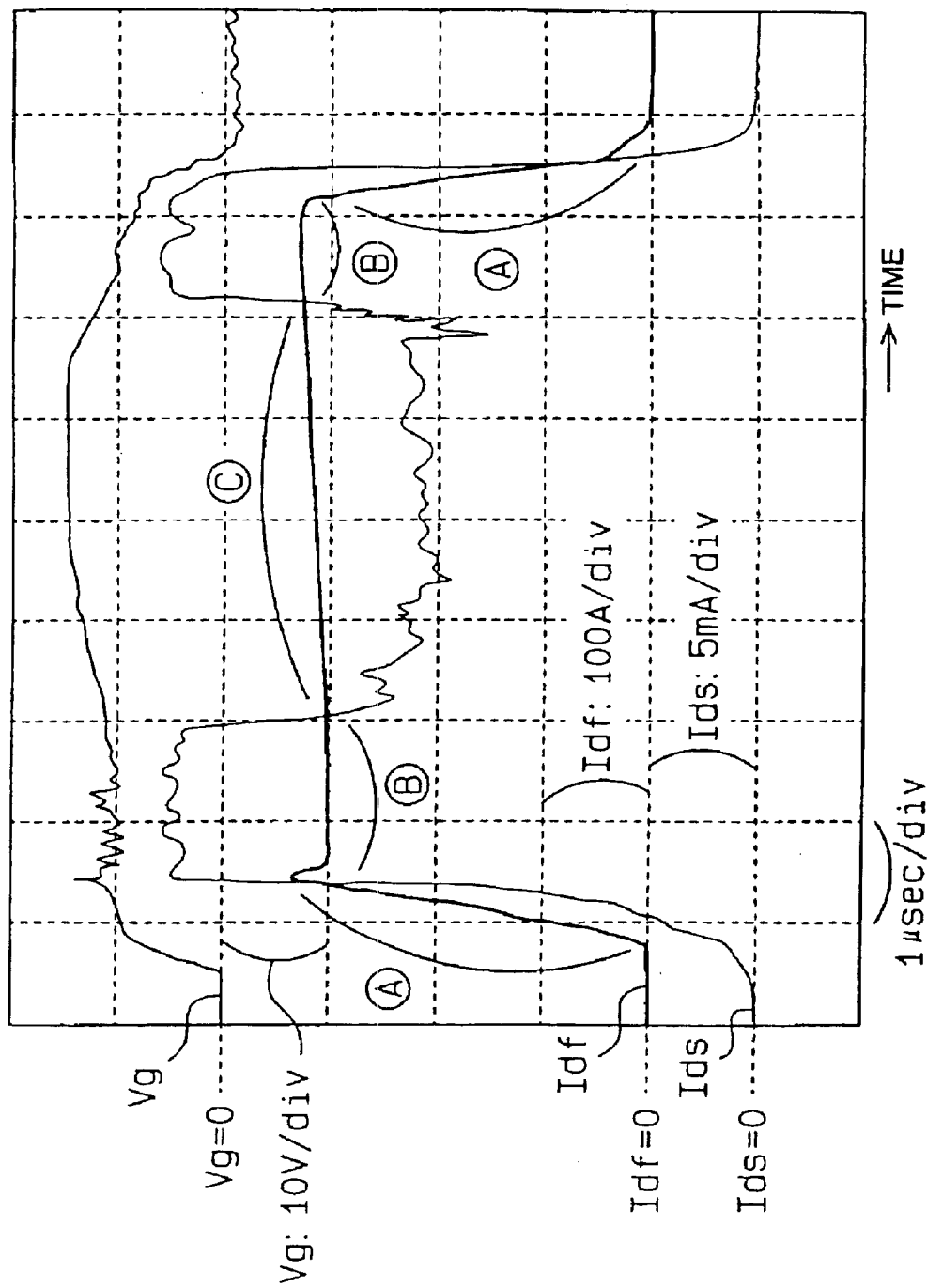
FIG. 28 is a waveform diagram showing results of measurements obtained using the circuit of FIG. 27.
Figure 29:
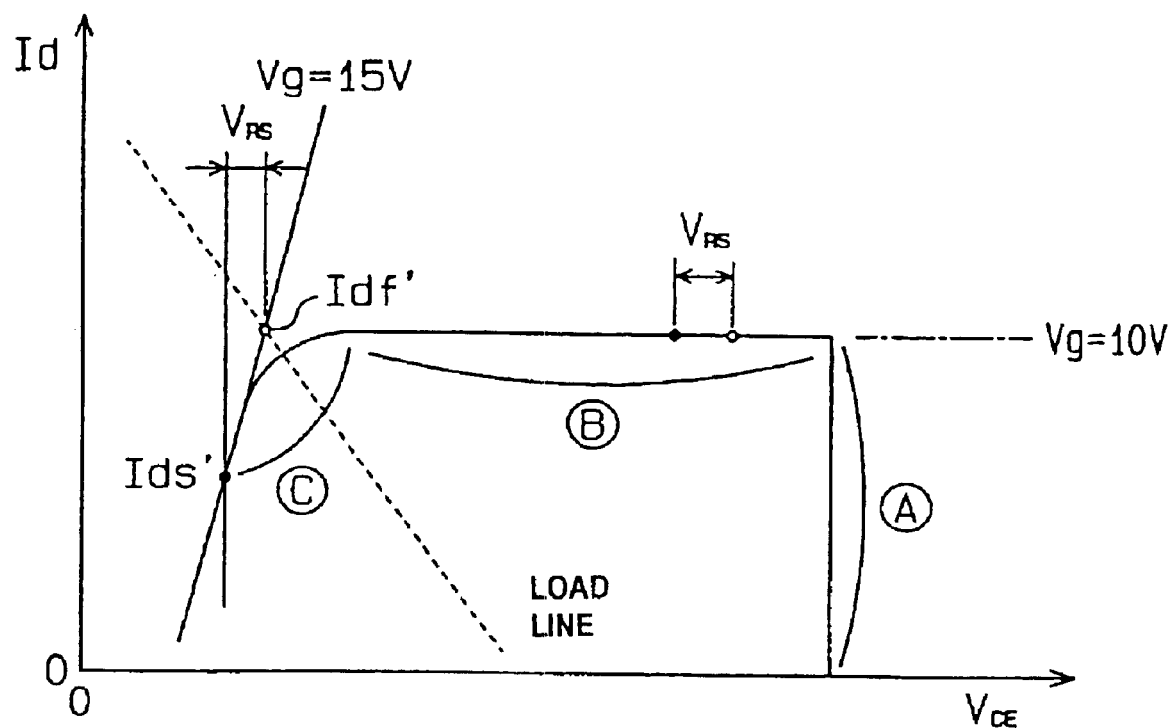
FIG. 29 is a Vcd-Id characteristic diagram for use in describing the results obtained in FIG. 28.

Furthermore although the above embodiment has been described for the case of application to MOSFET transistors, it would be equally possible to apply such an arrangement to monitor the current flow through a power IGBT (insulated gate bipolar transistor). To establish that fact, a test IGBT circuit of the form illustrated in FIG. 27 was configured, in which emitter currents Id1 and Id2 respectively corresponding to the drain currents Id1, Id2 of the MOSFET embodiment described above. FIG. 28 shows the results of measurements on the circuit of FIG. 27. As shown, when the transistors are switched between the OFF and ON states and between the ON and OFF states, i.e. when the gate input voltage Vg is within the ranges indicated by the circled letter B, there is a substantial rise in the level of Id2. Referring to the Id-Vce characteristic shown in FIG. 29, the regions indicated by the circled letters A, B and C therein respectively correspond to the similarly designated regions shown in FIG. 28.

It can thus be understood that if IGBTs were to be utilized as the sensing transistor Q2 and sensing transistor Q2 in a circuit such as that of FIG. 23 described above, similar effects to those described above for the case of utilizing MOSFETs could be obtained.

The above embodiment has been described on the assumption that compensation for the voltage drop across the sensing resistor Rs during operation in the saturation region is achieved by increasing the threshold voltage of the sensing transistor Q2 (i.e., by applying the substrate bias voltage Vb) during each interval in which that transistor is operating in the linear region, to thereby restrict the level of drain current of that transistor during these intervals, and so compensate for the effect of the voltage drop across the sensing resistor Rs upon that drain current when Q2 is operated in the saturation region. However various other possible arrangements of applying substrate bias to achieve a similar result could be envisaged, with the bias being applied to either the sensing transistor Q2 or the power transistor Q1, could be envisaged as described in the following.

Figures 31A, 31B:
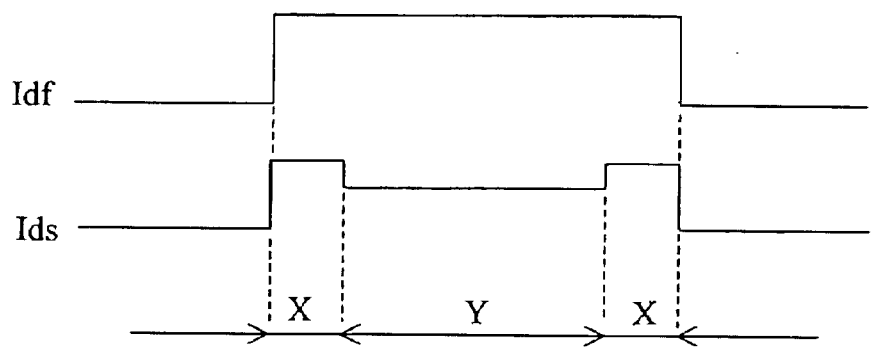
FIG. 31A is a table showing respectively different methods whereby a substrate bias voltage can be applied to a sensing transistor or power MOS transistor of an overcurrent limiting control circuit according to the present invention.
FIG. 31B is a simple timing diagram for specifying time intervals that are indicated in the table of FIG. 31A.

Table 1 of FIG. 31A, in conjunction with the simple timing diagram of FIG. 31B, illustrate these various possible methods of applying substrate bias. In FIG. 31b, the intervals designated as X represent the aforementioned switching transition intervals in which each transistor operates in the linear region, and Y represents an ON interval in which each transistor operates in the saturation region. Row 1 of Table 1 corresponds to the embodiment of FIG. 23 described above, in which a reverse bias (i.e., positive-polarity, since use of N-MOS transistors is assumed) substrate bias voltage Vb is applied to the sensing transistor Q2 during each of the X intervals, to thereby increase the threshold voltage of the sensing transistor Q2, and so reduce the level of drain current Id2 of transistor Q2 during each X interval.

With the arrangement shown in row 2 of Table 1, a negative (i.e., forward bias) substrate voltage is applied during each Y interval to the sensing transistor Q2, to thereby decrease the threshold voltage of that transistor and so increase the level of Id2 during each Y interval and so bring the waveform of Id2 into correspondence with that of the drain current Id1 of the power transistor Q1.

With the arrangement shown in row 3, a negative substrate bias voltage is applied to the power transistor Q1 during each X interval, to thereby decrease the threshold voltage of that transistor and so increase the level of Id1 during each Y interval, to thereby bring the waveform of Id1 into correspondence with that of Id2.

With the arrangement shown in row 4, a positive substrate bias voltage is applied to the power transistor Q1 during each Y interval, to thereby increase the threshold voltage of that transistor and so decrease the level of Id1 during each Y interval, to thereby bring the waveform of Id1 into correspondence with that of Id2.

It can be understood that each of these arrangements could provide identical results. However in a practical circuit, it is preferable to apply the substrate bias voltage to the sensing transistor Q2 (since it is formed of only a few drain/source cells, as opposed to the very large number of cells constituting a power transistor). In addition, it will generally be preferable to apply a reverse bias voltage rather than a forward bias.

What is claimed is:

1. A power MOS transistor formed as an array of source cells having respective source electrodes thereof connected in common and drain cells having respective drain electrodes thereof connected in common, and an array of gate electrodes which are connected in common, within a transistor formation area on a substrate, said power MOS transistor including
    a substrate region of a first conduction type extending within said substrate from an upper face of said substrate,
    a channel region of a second conduction type, formed in said substrate region, extending from said upper face,
    a plurality of source regions of the first conduction type, formed in said channel region and corresponding to said source cells,
    a plurality of drain regions of the first conduction type, respectively corresponding to said drain cells and extending from said upper face,
    said gate electrodes, each formed above said upper face, covering at least a part of said channel region and separated therefrom by a gate insulation film, and
    said source electrodes, each formed above said upper face, disposed in contact with said source regions through respective ones of said contact holes;
    wherein said power MOS transistor comprises a plurality of substrate contact cells, a plurality of body contact regions respectively corresponding to said substrate contact cells, and respective substrate potential-setting electrodes for use in setting a substrate potential of said channel region through said respective body contact regions,
    wherein each said body contact region is located separate from said areas occupied by said source regions, wherein each potential-setting electrode is separate from said source electrodes, and wherein said channel region is disposed surrounding each of said source regions and spaced apart from each of said drain regions.

2. A power MOS transistor according to claim 1, wherein said plurality of body contact regions is fewer in number than said plurality of source cells.

3. A power MOS transistor according to claim 1, wherein a plurality of second contact holes respectively corresponding to said body contact regions are formed, and wherein said substrate potential-setting electrodes are respectively disposed over corresponding ones of said body contact regions and in contact with said corresponding ones of said body contact regions through respective ones of said second plurality of contact holes, with each of said substrate potential-setting electrodes being located separate from said areas occupied by said source cells.

4. A power MOS transistor according to claim 3, wherein each said body contact region is formed within said channel region and is of the second conduction type.

5. A substrate potential control circuit coupled to each of said substrate potential setting electrodes of a power MOS transistor configured as claimed in claim 3, for controlling a substrate potential within at least a part of said transistor formation area.

6. A substrate potential control circuit as claimed in claim 5, further comprising a drive circuit for applying a gate drive signal to said gate electrode to switch said power MOS transistor between an ON and an OFF state, wherein said substrate potential control circuit is responsive to said gate drive signal for applying a substrate drive signal to said substrate potential setting electrodes whereby a difference between the potential of said gate electrode and said substrate potential is maintained substantially constant during said switching.

7. A substrate potential control circuit as claimed in claim 5, wherein said substrate potential control circuit comprises a substrate bias circuit responsive to said power MOS transistor being set in an OFF state by a drive signal applied to said gate electrodes for applying a reverse bias voltage to said substrate potential-setting electrodes to thereby increase a level of threshold voltage of said power MOS transistor, and responsive to said power MOS transistor being set in an ON state by said drive signal for reducing said reverse bias voltage.

8. A substrate potential control circuit as claimed in claim 5, wherein said substrate potential control circuit comprises a substrate bias circuit controllable for selectively applying respectively separate levels of reverse bias voltage to each of a plurality of sets of said substrate potential setting electrodes, with said sets being located in respectively different parts of said transistors formation area.

9. An overcurrent limiting control circuit for limiting a level of drain current of a power MOS transistor, said power MOS transistor being configured as claimed in claim 1 and having a load connected to said drain electrodes thereof, said load and power MOS transistor being connected in series across a power supply voltage source and said gate electrodes of said power MOS transistor coupled to receive a gate input signal which varies in voltage level for selectively switching said power MOS transistor to an ON and an OFF state, wherein said overcurrent limiting control circuit comprises
a sensing transistor formed on said substrate as a combination of least a source cell, having a corresponding source electrode, a drain cell, having a corresponding drain electrode, a gate electrode, and a substrate contact cell, baying a corresponding substrate potential-setting electrode, with said source electrode thereof connected to said source electrodes of said power MOS transistor, said gate electrode thereof connected to said gate electrodes of said power MOS transistor, and said source electrode and substrate potential-setting electrode thereof respectively separate from said source electrodes and substrate potential-setting electrodes of said power MOS transistor,
a sensing resistor connected to said drain electrode of said sensing transistor, with said sensing transistor and sensing resistor connected in series between said source and drain electrodes of said power MOS transistor,
current control circuit means coupled to said sensing resistor, for limiting a value of current flow through said load, based on a value of voltage drop across said sensing resistor, and
a substrate potential control circuit for supplying a substrate bias voltage to at least one of said substrate potential-setting electrode of said sensing transistor and said common-connected substrate potential-setting electrodes of said power MOS transistor during specific time intervals determined by occurrences of switching of said power MOS transistor between said ON and OFF states, for effecting a modification of a level of current flow through at least one of said sensing transistor and said power MOS transistor whereby a ratio of respective drain current levels of said power MOS transistor and said sensing transistor during each interval of switching transition between said ON and OFF states is made substantially identical to a ratio of said drain current levels during said ON state of said power MOS transistor.

10. The overcurrent limiting control circuit as claimed in claim 9, wherein said substrate potential control circuit determines a magnitude and polarity of said substrate bias voltage such as to effect a specific amount and direction of change in a value of threshold voltage of at least one of said sensing transistor and said power MOS transistor.

11. The overcurrent limiting control circuit as claimed in claim 10, wherein said substrate potential control circuit comprises
comparator means for detecting, based on a value of drain-to-source voltage of said power MOS transistor, when said power MOS transistor is operating in a first operating region wherein there is a substantially linear relationship between drain-to-source voltage and drain current, and in a second operating region wherein there is a saturation relationship between drain-to-source voltage and drain current, and
means for selectively applying said substrate bias voltage based on results of said detection.

12. The overcurrent limiting control circuit as claimed in claim 11, wherein said change in value of threshold voltage is predetermined in accordance with a value of said voltage drop across said sensing resistor which occurs while said power MOS transistor is in said ON state.

13. The overcurrent limiting control circuit as claimed in claim 12, wherein said substrate bias voltage is applied to said substrate potential-setting electrode of said sensing transistor, with a polarity and magnitude such as to produce a specific amount of lowering of said threshold voltage of said sensing transistor, during each of respective intervals in which said power MOS transistor is in the ON state.

14. The overcurrent limiting control circuit as claimed in claim 12, wherein said substrate bias voltage is applied to said substrate potential-setting electrode of said sensing transistor, with a polarity and magnitude such as to produce a specific amount of increase of said threshold voltage of said sensing transistor, during each of respective intervals of switching transition between said ON and OFF states of said power MOS transistor.

15. The overcurrent limiting control circuit as claimed in claim 14, wherein said substrate bias voltage is applied to said substrate potential-setting electrode of said sensing transistor, and wherein said substrate potential control circuit comprises
first comparator means for monitoring said gate input signal to detect occurrence of a first condition, wherein a voltage level of said gate input signal is within a range of values whereby said sensing transistor is set in the ON state, in the absence of said substrate bias voltage,
second comparator means for monitoring said drain-to-source voltage of said power MOS transistor to detect occurrence of a second condition, wherein said drain-to-source voltage is lower in magnitude than a value that is the sum of a voltage drop across said sensing resistor when said sensing transistor is operating in the ON state and a value of drain-to-source voltage of said sensing transistor when operating in the ON state,
logic circuit means coupled to said first and second comparator means, for detecting concurrent occurrence of said first and second conditions, and substrate bias voltage generating means controlled by said logic circuit means to apply said substrate bias voltage during each interval of said concurrent occurrence of the first and second conditions.

16. A power MOS transistor as claimed in claim 1, wherein said power MOS transistor is structured with a stripe configuration formed of a plurality of parallel rows of said source cells, alternating with parallel rows of said drain cells.

17. A power MOS transistor as claimed in claim 16, wherein a plurality of body contact regions are disposed within each of said rows of source cells, with respective substrate potential setting electrodes of said body contact regions within a row being coupled to a common connecting lead which is specific to said row and is isolated from said source electrodes.

18. A power MOS transistor as claimed in claim 17, wherein a number of said body contact regions within a row is smaller than a number of said source cells in said row, and wherein mutually adjacent body contact regions within said row are separated by a plurality of said source cells.

19. A power MOS transistor as claimed in claim 17, comprising a plurality of sets of rows of drain cells and rows of source cells with said body contact regions disposed therein, each of said sets having a substrate potential setting connecting lead which is coupled to all of said body contact regions in said set, with said substrate potential setting connecting leads of said sets of rows being mutually isolated.

* * * * *